United States Patent [19]
Vinal, deceased

[11] Patent Number: 5,391,949
[45] Date of Patent: Feb. 21, 1995

[54] DIFFERENTIAL LATCHING INVERTER CIRCUIT

[75] Inventor: Albert W. Vinal, deceased, late of Cary, N.C.

[73] Assignee: Thunderbird Technologies, Inc., Research Triangle Park, N.C.

[21] Appl. No.: 287,713

[22] Filed: Aug. 9, 1994

Related U.S. Application Data

[63] Continuation of Ser. No. 202,414, Feb. 25, 1994, abandoned, which is a continuation of Ser. No. 708,459, May 31, 1991, Pat. No. 5,304,874.

[51] Int. Cl.$^6$ .......................... G11C 7/00; H03F 3/45
[52] U.S. Cl. ..................... 327/53; 365/189.05; 365/205; 327/210; 327/215; 327/170
[58] Field of Search ............... 307/263, 272.1, 272.2, 307/279, 290, 291, 350, 352, 355, 530, 579, 585; 365/189.05, 205

[56] References Cited

U.S. PATENT DOCUMENTS

| | | | |
|---|---|---|---|
| 4,354,257 | 10/1982 | Varshney et al. | 365/219 |
| 4,601,017 | 7/1986 | Mochizuki et al. | 365/189 |
| 4,616,148 | 10/1986 | Ochii et al. | 307/530 |
| 4,728,823 | 3/1988 | Kinoshita | 307/291 |
| 4,816,706 | 3/1989 | Dhong et al. | 307/530 |
| 4,825,110 | 4/1989 | Yamaguchi et al. | 307/530 |
| 4,831,287 | 5/1989 | Golab | 307/530 |
| 4,843,264 | 6/1989 | Galbraith | 307/530 |
| 4,845,381 | 7/1989 | Cuevas | 307/264 |
| 4,845,675 | 7/1989 | Krenik et al. | 365/203 |
| 4,871,978 | 10/1989 | Galbraith | 307/530 |
| 5,095,225 | 3/1992 | Usui | 307/291 |
| 5,111,078 | 5/1992 | Miyamoto et al. | 307/451 |
| 5,192,878 | 3/1993 | Miyamoto et al. | 307/362 |

FOREIGN PATENT DOCUMENTS 53-124929 of 0000 Japan ........................ 307/530

OTHER PUBLICATIONS

*High–Sensitivity, High–Speed FET Sense Latch,* Bishop et al., IBM Technical Disclosure Bulletin, vol. 18, No. 4, Sep. 1975, pp. 1021–1022.

*Current–Mode Techniques for High–Speed VLSI Circuits With Application to Current Sense Amplifier for CMOS SRAM's,* Seevinck et al., IEEE Journal of Solid–State Circuits, vol. 26, No. 4, Apr., 1991, pp. 525–535.

*High Density SRAMs,* Ochii et al., IEEE International Solid–State Circuits Conference, 1985, pp. 64–65.

Primary Examiner—Terry D. Cunningham
Attorney, Agent, or Firm—Bell, Seltzer, Park & Gibson

[57] ABSTRACT

A differential latching inverter uses a pair of cross-coupled inverters having a skewed voltage transfer function to rapidly sense a differential signal on a pair of bit lines in a random access memory and provide high speed sensing during a read operation. The differential latching inverter may also include a pair of symmetrical transfer function output inverters and additional pull-up circuits to enhance high speed operation. The differential latching inverter may be used in a memory architecture having primary bit lines and signal bit lines, with a differential latching inverter being connected to each pair of signal bit lines. The primary bit lines and signal bit lines are coupled to one another during read and write operations and decoupled from one another otherwise. The read and write operations may be internally timed without the need for external clock pulses in response to a high speed address change detection system, and internal timing signals generated by delay ring segment buffers. A high speed, low power random access memory may thereby be provided.

11 Claims, 12 Drawing Sheets

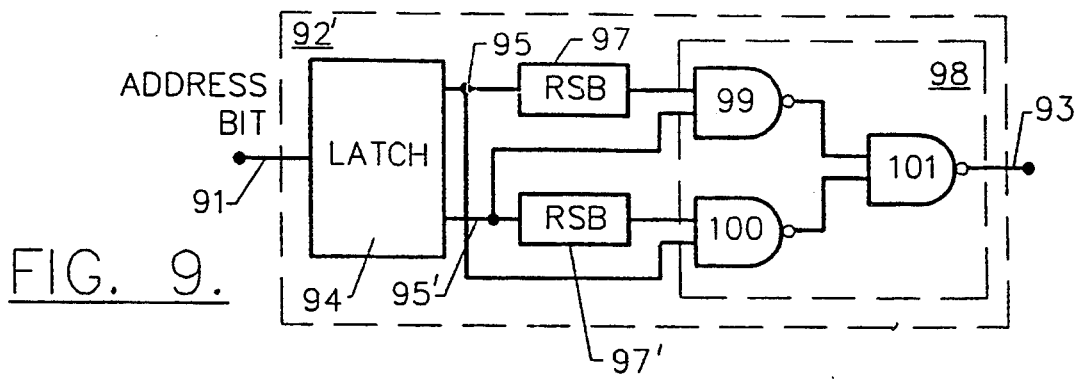
FIG. 9.
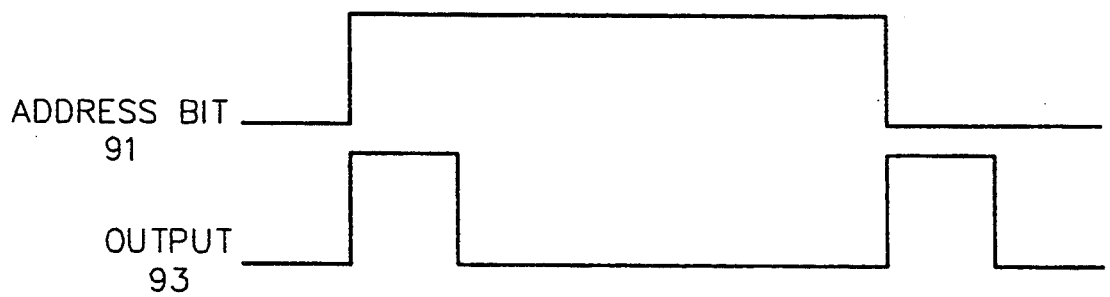
FIG. 10.
TRUTH TABLE: TDLU 92 (FIG. 8)
| LATCH OUTPUT TRANSITION | | NAND GATE OUTPUTS | | |
|---|---|---|---|---|
| 95 | 95' | 99 | 100 | 101 |
| 1→0 | 0→1 | NO PULSE | DOWN PULSE | UP PULSE |
| 0→1 | 1→0 | DOWN PULSE | NO PULSE | UP PULSE |
| NONE | NONE | NO PULSE | NO PULSE | DOWN PULSE |
FIG. 11A.
TRUTH TABLE: TDLU 92' (FIG. 9)
| LATCH OUTPUT TRANSITION | | NAND GATE OUTPUTS | | |
|---|---|---|---|---|
| 95 | 95' | 99 | 100 | 101 |
| 0→1 | 1→0 | NO PULSE | DOWN PULSE | UP PULSE |
| 1→0 | 0→1 | DOWN PULSE | NO PULSE | UP PULSE |
| NONE | NONE | NO PULSE | NO PULSE | DOWN PULSE |
FIG. 11B.

DIFFERENTIAL LATCHING INVERTER CIRCUIT

This application is a continuation of application Ser. No. 08/202,414, filed Feb. 25, 1994, now abandoned, which is itself a continuation of application Ser. No. 07/708,459, filed May 31, 1991, now U.S. Pat. No. 5,304,874.

FIELD OF THE INVENTION

This invention relates to semiconductor memory devices and more particularly to high speed, high density, low power random access memories.

BACKGROUND OF THE INVENTION

Read/write memories, also referred to as Random Access Memories (RAM) are widely used to store programs and data for microprocessors and other electronic devices. The availability of high speed, high density and low power RAM devices has played a crucial role in the price reduction of personal computers and in the integration of computer technology into consumer electronic devices.

A typical RAM includes a large number of memory cells arranged in an array of rows and columns. Each memory cell is typically capable of storing therein a binary digit, i.e. a binary ONE or a binary ZERO. Each row of the memory cell array is typically connected to a word line and each column of the memory cell array is typically connected to a pair of bit lines. Read and write operations are performed on an individual cell in the memory by addressing the appropriate row of the array using the word lines and addressing the appropriate cell in the addressed row using the bit lines. Depending upon the signals applied to the bit lines, a write operation may be performed for storing binary data in the RAM or a read operation may be performed for accessing binary data which is stored in the RAM. When read and write operations are not being performed, the RAM is typically placed in an idle operation for maintaining the binary data stored therein.

RAMs are typically divided into two general classes, depending upon the need to refresh the data stored in the RAM during the idle state. In particular, in a Dynamic Random Access Memory (DRAM), the data stored in the memory is lost unless the memory is periodically refreshed during the idle operation. In contrast, in a Static Random Access Memory (SRAM) there is no need to refresh the data during an idle operation, because the data stored therein is maintained as long as electrical power is supplied to the SRAM. In the present state of the art, it is generally possible to fabricate higher density DRAM arrays than SRAM arrays because the individual memory cells of a DRAM include fewer transistors than the individual cells of an SRAM. However, SRAMs tend to operate at higher speeds than DRAMs, because there is no need to refresh the data stored therein. Accordingly, both SRAMs and DRAMs are typically used in computer systems, with the SRAMs being used for high speed memory (often referred to as "cache" memory), while the DRAM is typically used for lower speed, lower cost mass memory.

Three general design criteria govern the performance of random access memories. They are density, speed and power dissipation. Density describes the number of memory cells that can be formed on a given integrated circuit chip. In general, as more cells are fabricated on a Very Large Scale Integration (VLSI) chip, cost is reduced and speed is increased.

The performance of random access memories is also limited by the power consumption thereof. As power consumption increases, more sophisticated packaging is necessary to allow the integrated circuit to dissipate the high power. Moreover, high power circuits require expensive power supplies, and limit applicability to portable or battery powered devices.

Finally, speed is also an important consideration in the operation of a random access memory because the time it takes to reliably access data from the memory and write data into the memory is an important parameter in the overall system speed. It will be understood by those having skill in the art that the parameters of speed, density and power dissipation are generally interrelated, with improvements in one area generally requiring tradeoffs in one or more of the other areas.

In designing high density, high speed, low power random access memories, two general design areas may be pursued. The first is the design of the memory cell itself. For example, in a static random access memory, improved memory cell designs can permit high speed memory operations at low power consumption. One such improved design is described in copending application Ser. No. 07/619,101 entitled *Static Random Access Memory (SRAM) Including Fermi Threshold Field Effect Transistors*, by the present inventor Albert W. Vinal and assigned to the assignee of the present invention. A high density, high speed, low power SRAM cell is described.

A second major area in designing a high speed, high density, lower power random access memory is the design of the supporting circuits which allow reading of data into, writing of data from, and operational control of, the random access memory array. These circuits for reading, writing and controlling the operation of the RAM cell array are often critical limitations in the design of a high speed, high density, low power random access memory.

One particular criticality in the design of random access memory is the sense circuitry which is used to detect a binary ONE or binary ZERO from one or more cells in the random access memory during a read operation. Known sensing designs are slow, power hungry, and have consumed a disproportionate amount of chip "real estate" (area). In particular, a linear analog sense amplifier is typically used to amplify the signal from a selected cell in the memory in order to detect a binary ONE or binary ZERO, which is typically represented by a particular voltage level at the output of a selected cell.

In order to properly sense one of two voltage levels at the output of a particular cell, linear analog sense amplifiers typically require a reference or bias voltage, midway between the two voltage levels. See for example U.S. Pat. No. 4,914,634 to Akrout et al. entitled *Reference Voltage Generator for CMOS Memories*. Unfortunately, reference voltage generating circuits typically consume relatively large amounts of power on the integrated circuit and also take up critical chip area.

Linear analog sense amplifiers have also required equalization of the bit lines prior to sensing, in order to prevent an imbalance in the bit lines from producing false data values. See for example U.S. Pat. No. 4,893,278 to Ito entitled *Semiconductor Memory Device Including Precharge/Equalization Circuitry For The Complementary Data Lines*. Unfortunately, the need for equalization adds to the complexity of the circuitry on the memory. Equalization also generally requires balanced transistors in the entire memory, thereby requiring tighter transistor tolerances and lowering the yield of the integrated circuit devices.

High gain, high speed linear sense amplifiers have reduced tolerance for imbalance, thereby decreasing the number of cells that can be coupled to the sense amplifier and further limiting the density of the memory array. The linear sense amplifier also limits the speed of the memory because linear sense amplifiers are limited by a given gain-bandwidth product, so that the higher the gain required, the slower the speed of the linear sense amplifier and vice versa.

Since linear sense amplifiers consume high power, many memory designs deactivate the sense amplifiers when a read operation is not being performed. Unfortunately, deactivation reduces the speed of the memory device because the sense amplifiers must be reactivated prior to a read operation.

Finally, at some point during the linear amplification of a read signal, the linearly amplified signal must be nonlinearly converted into a binary ONE or ZERO. Accordingly, the output of a sense amplifier is typically coupled to a latch, to thereby produce one or the other binary state. See for example U.S. Pat. No. 4,843,264 to Galbraith entitled *Dynamic Sense Amplifier For CMOS Static RAM,* and U.S. Pat. No. 4,831,287 to Golab entitled *Latching Sense Amplifier.* Unfortunately, sense amplifiers which include a combination of a linear analog sense amplifier and a nonlinear latch are complicated and are difficult to accurately control for high speed operation.

SUMMARY OF THE INVENTION

It is therefore an object of the present invention to provide an improved sense circuit for use in a memory.

It is another object of the invention to provide a sensing circuit which is capable of sensing binary data at high speed and with low power dissipation.

It is yet another object of the invention to provide a high speed, low power random access memory design.

These and other objects are provided according to the present invention by a Differential Latching Inverter (DLI) which is responsive to the voltage on a pair of differential inputs thereto. The Differential Latching Inverter (DLI) may be connected to a pair of bit lines in a memory array, for sensing the binary state of the state of a selected memory cell. When one of the input signals to the DLI rise above a predetermined threshold, the DLI is responsive to a small differential component between the signals applied thereto to rapidly latch the output of the inverter to one logical state or another. For example, in a memory using five volt and ground reference voltages, when an input signal to the DLI is above one volt, and an input differential of at least two millivolts is present between the input signals, the DLI rapidly latches up to a first or a second logical value depending upon which of the inputs has the higher input differential.

The Differential Latching Inverter of the present invention may be implemented using a minimal number of field effect transistors, as described below, and does not require the generation of a separate reference voltage or require high gain analog linear sense amplifiers for operation. Accordingly, high speed, low power, high density sensing of signals stored in a random access memory is provided.

A basic design of a Differential Latching Inverter of the present invention includes a pair of complementary field effect transistor inverters, each of which is connected between first and second reference voltages, typically the power supply voltage $V_{DD}$ and ground, with each inverter including an input and an output. According to the invention, the FETs of each of the first and second complementary inverters are designed to produce an inverter transfer function which is skewed toward one of the first or second reference voltages. In other words, the inverters do not produce a symmetrical inverter transfer function relative to the first and second reference voltages. Rather, the transfer function is skewed toward one of the reference voltages. In a preferred embodiment, the voltage transfer function is skewed towards ground by a factor of $2\frac{1}{2}$ less than a symmetrical inverter, so that a voltage threshold of about one volt causes the inverter to rapidly change state, upon sensing a voltage differential of about two millivolts.

The first and second skewed inverters of the present invention are cross coupled by connecting the input of the first inverter to the output of the second inverter and the input of the second inverter to the output of the first inverter, to thereby create a latch. A first bit line is connected to the input of the first inverter and a second bit line is connected to the input of the second inverter.

The Differential Latching Inverter (DLI) of the present invention exhibits three states. When one or the other input to the DLI rises above the threshold voltage and an input differential of two millivolts or greater is found between the two bit line inputs, the DLI latches to a binary ONE or binary ZERO state. In a third or reset state, in which the bit line inputs thereto are both below the DLI's threshold voltage, both outputs of the DLI are ZERO. No DC power is dissipated by the DLI in either of its three stable states, and minimal power is dissipated by the DLI when it switches from one state to another.

The skewed transfer function, first and second complementary inverters of the DLI may be produced by controlling the dimensions of the complementary FET transistors of the skewed inverters so that the product of the square channel saturation current and the ratio of channel width to length of the FETs of a first conductivity type is substantially greater than the product of the square channel saturation current and the ratio of the channel width to length of the FETs of the second conductivity type. Preferably, the products of the square channel saturation current and the ratio of channel width to length differ by a factor of ten.

In a particular embodiment of the DLI, a pair of pull-up FETs may also be provided, with the controlled electrodes (source and drain) of a first pull up FET being connected between the first reference voltage and the output of the first complementary FET inverter, and the controlled electrodes of a second pull-up FET being connected between the first reference voltage and the output of the second complementary FET inverter. The controlling electrode (gate) of the first pull-up FET is connected to the output of the second complementary FET inverter and the controlling electrode of the second pull-up FET is connected to the output of the first complementary FET inverter. These cross coupled pull-up FETs increase the latching speed of the DLI.

The output of the first and second complementary inverters may be coupled to a third and a fourth complementary FET inverter, respectively. The third and fourth inverters produce an inverter voltage transfer function which is symmetrical between the first and second reference voltages. The outputs of the differential latching inverter are the outputs of the third and fourth complementary FET inverters.

The DLI may also include a second pull up circuit, which is connected to the outputs of the first and second skewed transfer function inverters, for rapidly pulling the outputs of the first and second inverters to the first reference voltage ($V_{dd}$), and thereby pulling the outputs of the third and fourth symmetrical transfer function inverters to the second reference voltage (ground) in response to an input signal applied thereto. The input signal is applied immediately upon a successful data read, or immediately upon verification of a successful data write, to rapidly bring the DLI to the third (reset) state and prepare the DLI for a next read or write operation. External clock timing is not required. Rather, the reset set is initiated internally, upon completion of a read or write operation.

The Differential Latching Inverter of the present invention may be used in a high speed, high density, low power random access memory architecture as follows. An array of memory cells is arranged in a plurality of rows and columns, with a word line connected to each row and a pair of primary bit lines connected to each column. Signal bit lines are provided, orthogonal to the primary bit lines, and a respective pair of signal bit lines is connected to at least one respective pair of the primary bit lines. A DLI is connected between each pair of signal bit lines.

The primary bit lines are coupled to a first reference voltage, typically power supply voltage $V_{DD}$, during the idle operation, and a selected one of the primary bit line pairs is decoupled from the first reference voltage during a write operation. The signal bit lines are coupled to a second reference voltage, preferably ground, during an idle operation and are decoupled from the second voltage during a read or write operation. The primary bit lines and the signal bit lines are coupled together during read and write operations and decoupled from one another during an idle operation.

Accordingly, during an idle operation each of the primary bit line pairs is referenced to $V_{DD}$ and each of the signal bit line pairs is referenced to ground. All of the DLIs are in their third or reset state. In order to read, the signal bit lines are decoupled from the second voltage reference source (ground) and the primary bit lines remain coupled to the first voltage reference source ($V_{DD}$). A word decoder selects a given row. A bit decoder couples a primary bit line pair in a selected column to its associated signal bit line pair. The amount of voltage delivered to one bit line or the other of the selected primary bit line pair drops more rapidly than the other due to the current conducted by one of the memory cell pass transistors, as controlled by the state of the selected memory cell being read. This current differential translates to a voltage differential on one or the other of the signal bit lines of the associated signal bit line pair. When the voltage differential on one of the signal bit lines exceeds the DLI's threshold voltage, the DLI will rapidly latch into one or the other state depending on the signal bit line which had the higher voltage. Accordingly, high speed sensing of data read from a random access memory is provided with minimal supporting circuitry.

The outputs of all of the DLIs may be directly connected to a pair of OR gates, with the output of one OR gate signifying that a logical ONE has been read and the output of the second OR gate signifying that a logical ZERO has been read. Connection of all of the DLIs to a single OR gate for reading is possible because all of the DLIs which are not being read are in their third or reset state with both outputs thereof at ground potential. The output of the activated DLI may be placed in a read register and provided as the memory output. Once a DLI has been latched and the data has been read, the memory is rapidly restored to the idle state by pulling the active DLI back to its idle state. The signal bit lines are recoupled to ground, the primary bit lines remain coupled to $V_{DD}$ and the signal bit lines and primary bit lines are decoupled from one another. Accordingly, a self-timing operation is provided.

In a write operation, a word decoder selects a given row, a selected pair of primary bit lines is decoupled from $V_{DD}$ by a decoded write gate, and one selected primary bit line pair is coupled to an appropriate signal bit line pair. One of the signal bit lines is clamped at a LOW level thereby forcing the associated primary bit line towards ground. This forces one side of the selected memory cell towards ground while holding the other side to greater than $V_{DD}/2$, thereby storing data into the selected RAM cell. At the same time, the data written into the selected memory cell is also read by the associated DLI as described above. The successful read causes the memory to be reset in its idle state as described above.

According to another aspect of the present invention a circuit may be used with the DLI and memory architecture described above, to detect an address change at the memory input and initiate a read or write operation. The address change detection system uses a transition detection delay unit for each address bit of the memory. The transition delay unit is responsive to a change in its associated address bit to provide a clock output pulse of predetermined duration.

The transition detection delay unit comprises a latch which is coupled to the associated address bit, and a pair of Delay Ring Segment Buffers each coupled to a respective output of the latch. The design and operation of the Delay Ring Segment Buffer is described in copending application Ser. No. 07/497,103 entitled *High Speed Logic and Memory Family Using Ring Segment Buffer* by the present inventor Albert W. Vinal, assigned to the assignee of the present invention, the disclosure of which is hereby incorporated herein by reference. The output of the delay ring segment buffer is provided to cascaded NAND gates to form the output of the transition detection delay unit.

The outputs of all of the transition detection delay units are provided to an OR gate which is preferably a Complementary Logic Input Parallel (CLIP) OR gate, as described in application Ser. No. 07/648,219 entitled *Complementary Logic Input Parallel (CLIP) Logic Circuit Family* by the present inventor Albert W. Vinal and assigned to the assignee of the present invention, the disclosure of which is incorporated herein by reference. The output of the CLIP OR gate provides an indication of an address change. Accordingly, the transition detection delay unit uses simple circuitry to detect an address change, with less time delay than known address change detection circuits. Similar transition detection is employed to detect a chip select active transition and a write enable transition. The outputs of these transition detect delay units are also coupled to the CLIP OR gate, and are also used to activate the memory cycle.

Once a change in the address has been detected, or a chip select or write enable signal has been detected, internal timing of the memory may be provided by a series of Delay Ring Segment Buffers. The Delay Ring Segment Buffers provide the required timing signals to word and bit decoders and the DLIs as described above. Once the data has been read, or data has been written and verified, the timing circuitry generates a reset signal to rapidly place the memory in the idle state. Self-timing of memory operations is thereby provided.

It will be understood by those having skill in the art that the Differential Latching Inverter of the present invention may be used in conjunction with other memory architectures than described herein. Similarly, the memory architecture described herein may be used with sensing circuits other than the Differential Latching Inverter. Finally, the unique control circuits such as the address detection change circuits and the timing circuits using ring segment buffers, may be used to control memories other than those described herein. However, it will be also be understood by those having skill in the art that the unique combination of the DLI, memory architecture and supporting control circuitry described herein provides a high density, high speed random access memory with very low power dissipation.

BRIEF DESCRIPTION OF THE DRAWINGS

FIG. 9 illustrates a block diagram of an alternative address change detection circuit according to the present invention.

FIG. 10 illustrates a timing diagram for operation of the address change detection circuits of FIGS. 8 and 9.

FIGS. 11A and 11B are truth tables to illustrate the operation of the address change detection circuits of FIGS. 8 and 9 respectively.

DESCRIPTION OF A PREFERRED EMBODIMENT

The present invention now will be described more fully hereinafter with reference to the accompanying drawings, in which a preferred embodiment of the invention is shown. This invention may, however, be embodied in many different forms and should not be construed as limited to the embodiment set forth herein; rather, this embodiment is provided so that this disclosure will be thorough and complete, and will fully convey the scope of the invention to those skilled in the art. Like numbers refer to like elements throughout.

The design and operation of the random access memory of the present invention will be described by first describing the Differential Latching Inverter (DLI). The overall architecture of the memory array including the Differential Latching Inverter will then be described, followed by the operation of the memory during idle, read and write cycles. The control circuits for performing the read, write and idle operations will then be described.

DIFFERENTIAL LATCHING INVERTER

Figure 1:
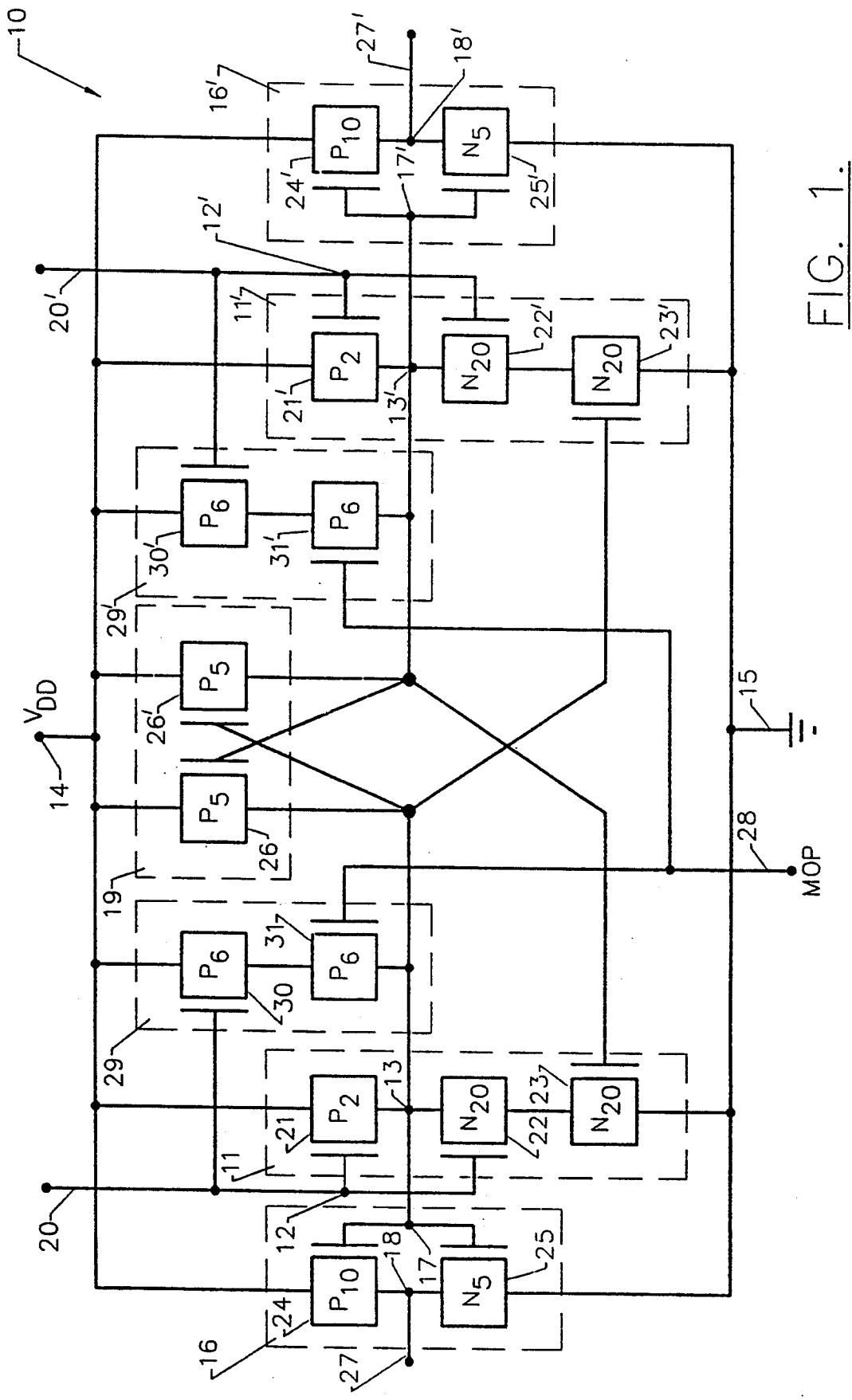
FIG. 1 illustrates a schematic circuit diagram of a Differential Latching Inverter according to the present invention.

Referring now to FIG. 1, a Differential Latching Inverter (DLI) according to the present invention will now be described. As shown in FIG. 1, DLI 10 includes a pair of cross coupled, skewed transfer function complementary field effect transistor inverters 11, 11'. The manner in which the skewed transfer function inverters are designed will be described below. When the input signals on one of bit lines 20 or 20' rise above the DLI's threshold voltage, and a small differential signal component, for example at least two millivolts, is present, a binary output latchup condition rapidly occurs that produces a binary ONE value at one of output terminals 27, 27' of the DLI and a binary ZERO value at the other one of output terminals 27, 27' of the DLI. The binary signal state of the selected RAM cell being read is determined by which output terminal 27, 27' of the DLI is HIGH.

The skewed inverters 11, 11' are connected between a first reference voltage 14 (here shown as power supply voltage $V_{DD}$) and a second reference voltage 15 (here shown as ground). The input 12, 12' of a respective inverter 11, 11' is connected to a respective one of a pair of bit lines 20, 20'. As also shown in FIG. 1, the skewed complementary inverters 11, 11' are cross coupled, with the output 13 of inverter 11 being connected to an input of inverter 11' and the output 13' of inverter 11' being connected to an input of inverter 11.

It Will be understood by those having skill in the art that skewed complementary inverters 11, 11' may be formed using a pair of complementary (i.e. N-channel and P-channel) field effect transistors, with the inverter input being the gates of the transistors and the sources and drains of the transistors being serially connected between power supply and ground, and the inverter output being the connection node between the field effect transistors. However, a preferred embodiment of the skewed inverters 11, 11' is as illustrated in FIG. 1. As shown, each inverter comprises a first conductivity (P-channel) transistor 21, 21' and a pair of second conductivity (N-channel) transistors 22, 22' and 23, 23', respectively. The controlled electrodes of these transistors (drains and sources) are serially connected between the power supply 14 and ground 15. The gates of transistors 21 and 22 are coupled to bit line 20 and the output of the inverter 13 is the connection node between P-channel transistor 21 and N-channel transistor 22. Similar connections apply to inverter 11'. In order to cross couple the inverters, the output 13 of inverter 11 is coupled to the gate of transistor 23' and the output 13' of inverter 11' is coupled to the gate of transistor 23.

DLI 10 also includes an optional pair of symmetrical transfer function inverters 16, 16' with each symmetrical inverter 16, 16' comprising a pair of complementary transistors 24, 24' and 25, 25', connected between power supply voltage 14 and ground 15. The input 17, 17' of the symmetrical inverter 16, 16+ is connected to the respective output 13, 13' of the skewed inverter 11, 11'. The outputs 18, 18' of the symmetrical inverter 16, 16' form the outputs 27, 27' of the DLI. The manner in which symmetrical inverters 16, 16' are designed will be described below.

DLI 10 also includes optional pull-up circuit 19. As shown, pull-up circuit transistors 26, 26' are connected between power supply 14 and the respective output 13, 13' of skewed inverter 11, 11'. The gates of pull up transistors 26, 26' are cross-coupled to the respective output 13, 13' of the skewed inverter 11, 11'.

Still referring to FIG. 1, an optional second set of 29, 29' of pull-up transistors is provided. Each optional second pull-up circuit 29, 29' includes a pair of transistors 30, 30' and 31, 31', serially coupled between power supply voltage 14 and a respective output 13, 13' of the skewed inverter 11, 11'. As shown, the gate of one transistor 30, 30' is connected to the respective bit line 20, 20' and the gates of the other transistors 31, 31' are coupled together to form a memory operation (MOP) input 28. The operation of this MOP input will be described in detail below. Briefly, during read or write operation, the MOP input 28 is high so that it doesn't effect operation of the DLI. However, at the conclusion of a read or write operation, the MOP input 28 is brought LOW to turn on the pull-up circuit 29, 29', and rapidly force nodes 13, 13' to $V_{DD}$, thereby forcing DLI outputs 27, 27' to ground.

Figure 2:
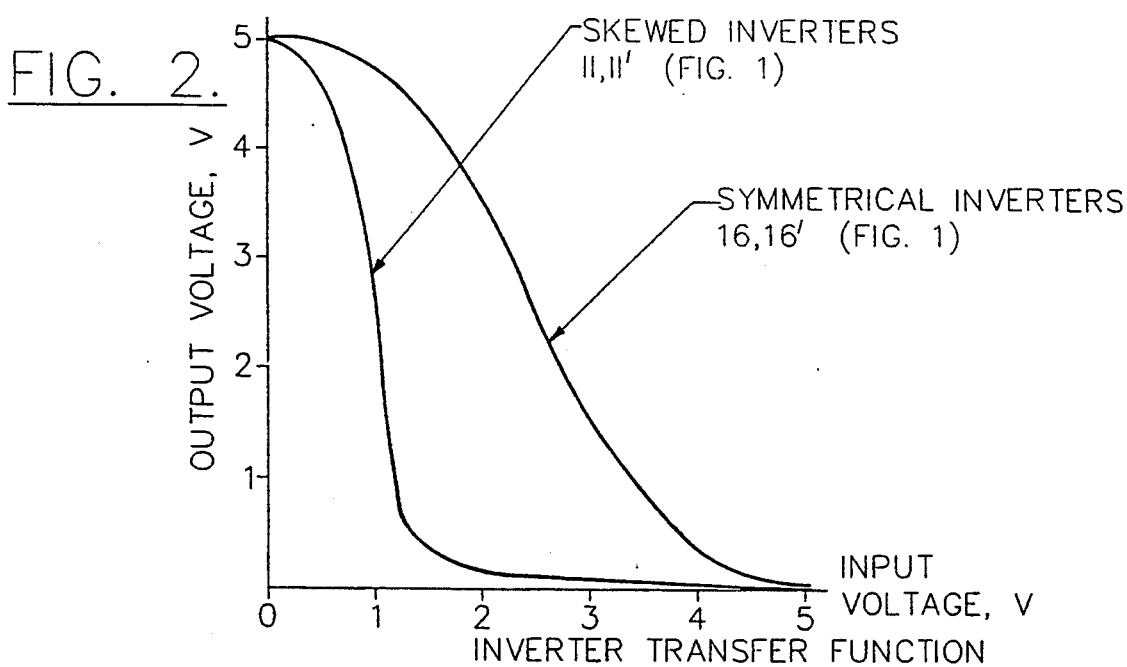
FIG. 2 illustrates the inverter transfer functions of the symmetrical inverters and the skewed inverters of the Differential Latching Inverter of FIG. 1.
Figure 3A:
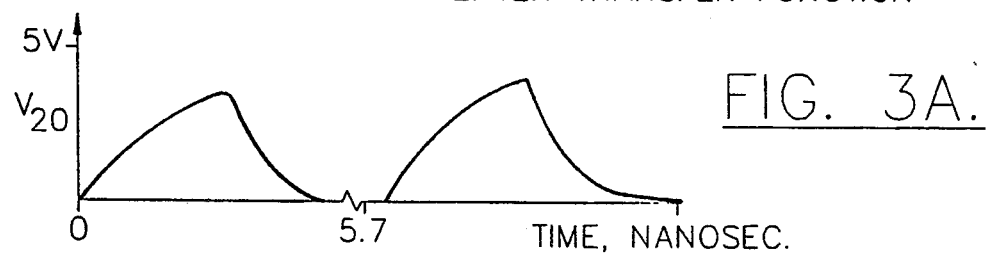
FIGS. 3A–3D illustrate timing diagrams for operation of the Differential Latching Inverter of FIG. 1.
Figure 3B:
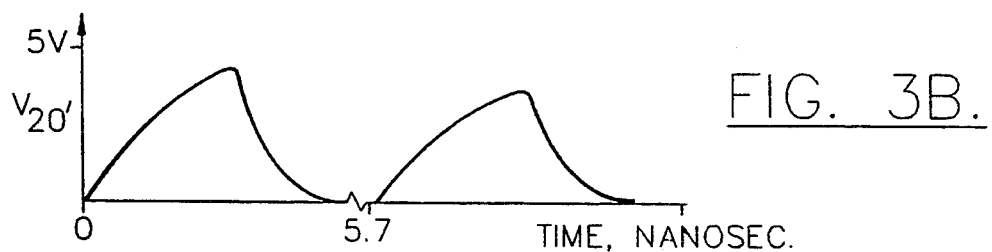
Figure 3C:
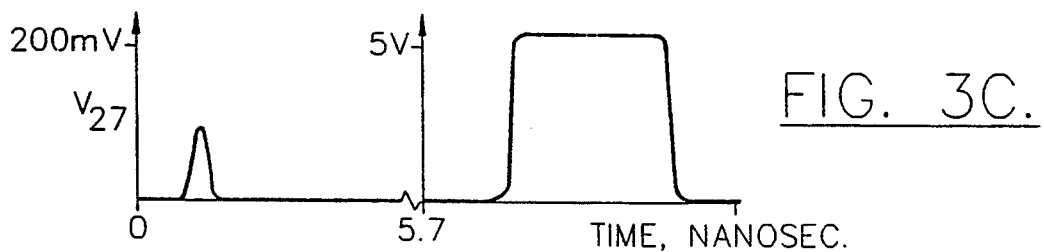
Figure 3D:
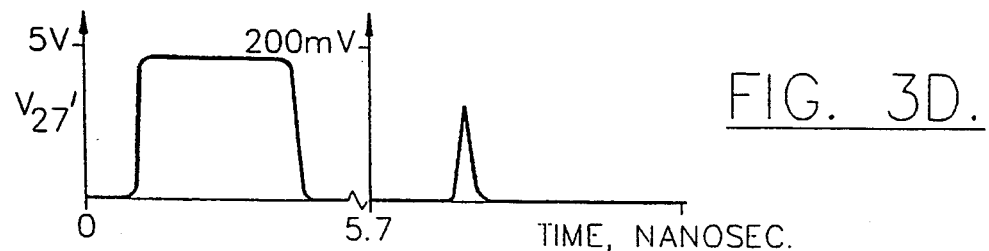

Referring now to FIG. 2, the inverter transfer functions of symmetrical inverters 16, 16' and skewed inverters 11, 11' are shown. As shown, the output voltages (at nodes 13, 13') of the skewed inverters 11, 11' are skewed towards the second reference potential 15 (i.e. ground) relative to the input voltages thereof (at nodes 12, 12'). In particular, for reference voltages of 5 volts and ground, the output voltages of skewed inverters 11, 11' rapidly change state at an input voltage of about one volt. Stated differently, the output voltage is skewed by a factor of 2½ less than a symmetrical inverter. This contrasts with the inverter transfer function of the symmetrical inverters 16, 16', the output voltages of which (at nodes 18, 18') change state symmetrically about an input voltage (at nodes 17, 17') approximately midway between the first reference voltage 14 and the second reference voltage 15. For five volt and ground reference voltages, the symmetrical inverters switch state at about 2.5 volts.

Left hand skewing of inverters 11, 11' accomplishes two primary results. First, it allows DLI 10 to sense a voltage differential on bit lines 20, 20' immediately after one of the bit lines rises above the noise level. Sensing need not wait until the bit lines rise to half the power supply voltage. Second, it causes the slope (voltage gain) of the transfer function at the skewed switching point to be much higher than it is at the midway point.

Compare the slopes of the two curves of FIG. 2. Rapid latchup is thereby provided.

Left hand skewing of the voltage transfer function of inverters 11, 11' is accomplished by making the product of the N-channel transistor (22, 22', 23, 23') maximum square channel saturation current (I*satN) and the channel width-to-length ratio of the N-channel transistors substantially larger than the product of the P-channel square channel saturation current (I*satP) and the channel width-to-length ratio of the P-channel transistors 21—21'. It will be understood by those having skill in the art that the square channel saturation current is the maximum current which can be produced by a channel having equal length and width. The square channel saturation current is proportional to the value of the carrier mobility in the respective transistor; i.e. the electron mobility in the N-channel transistor and the hole mobility in the P-channel transistor. Since the channel lengths of all FET transistors in a typical integrated circuit are generally made equal, above the relationship may be generally represented as:

$$(I^*satN)(Z_N) >> (I^*satP)(Z_P)$$

Preferably the product of saturation current and channel width of the N-channel devices is made ten times greater than that of the P-channel devices. For silicon devices having equal channel lengths, the relative channel widths of the P-channel devices 21, 21' and the N-channel devices 22, 22', 23, 23' are shown in FIG. 1 inside the respective transistors. These channel widths can be scaled to any desired groundrules.

As also shown in FIG. 2, inverter 16, 16' has a symmetrical voltage transfer function. This is obtained by making the product of the square channel saturation current and the width-to-length ratio of the P-channel transistors substantially equal to that of the N-channel transistors. Since for silicon, the P-channel transistor has a square channel saturation current about half that of a N-channel transistor, the symmetrical transfer function is obtained by making the channel the P-channel transistor twice as wide as the N-channel transistor. The relative dimensions are shown in each transistor in FIG. 1.

DIFFERENTIAL LATCHING INVERTER OPERATION

Operation of the Differential Latching Inverter (DLI) 10 of FIG. 1 will now be described. In general, when the input signal on one of bit lines 20, 20' rises above the DLI's threshold voltage, the DLI outputs 27, 27' rapidly latch to represent one or the other binary signal state. Specifically, when one of the signals on the bit lines 20, 20' is above the threshold voltage of the DLI, and a small differential signal component, for example of at least two millivolts, is present, a binary output latchup condition rapidly occurs that produces a binary ONE signal at one output terminal 27, 27' of the DLI and a binary ZERO (down) signal at the other output 27, 27' of the DLI. The binary signal state of the selected memory cell being read is determined by which output terminal 27, 27' of the DLI is HIGH. For example, when output 27 goes up to $V_{DD}$, a binary ONE has been read from memory, and when output 27' goes up to $V_{DD}$ a binary ZERO has been read from memory.

The DLI has a third or reset state that occurs when both outputs 27 and 27' are at DOWN level (i.e. at or near ground level). The third state is automatically set when the bit lines 20, 20' are both at or near ground potential. When the DLI is not being called to read or write, both of the bit lines 20, 20' are placed at ground potential so that both output terminals 27, 27' are at LOW output state, i.e. at ground. It will be understood by those having skill in the art that substantially no DC power is dissipated by DLI 10 in any of the three stable states. Minimal power is dissipated only during the switching interval; i.e. when switching from one state to another. The amount of power dissipated is a function of the switching frequency.

During a read operation, a selected bit line pair is coupled to a single memory cell selected by a word line. Once coupled together, the voltage on bit lines 20, 20' both ramp-up from ground. However, the ramp-up rate is faster on one bit line than the other bit line as a function of whether the selected memory cell is storing a binary ONE or ZERO.

It will be recalled that the inverter transfer function of inverters 11, 11' is skewed towards ground potential. For example, voltage level transfer may occur at around one volt. Accordingly, assume that the voltages on bit lines 20 and 20' are increasing from ground, but that the voltage on bit line 20 is increasing from ground at a slightly faster rate due to the binary value stored in the selected RAM cell. When the voltage on bit line 20 exceeds one volt, the output 13 of inverter 11 rapidly switches LOW (to ground potential), forcing the output 13' to remain HIGH (near $V_{DD}$). Since output 13 is at ground potential, the input to cross-coupled transistor 23' is also at ground potential turning off transistor 23' and thereby forcing node 13' to $V_{DD}$. Accordingly, latch-up rapidly occurs.

In summary, the DLI includes a feedback mode of operation which results in a high gain rapid latching condition determined by the imbalance in input (bit line) ramp-up voltage rates. A two millivolt difference between the input signals above threshold is sufficient to cause the desired latch-up state. The sensitivity of the DLI to the RAM cell state to induce a differential signal component during a read cycle is primarily due to the heavily left hand skewed voltage transfer function in the inverters 11, 11'.

The first pull-up circuit 19 increases the latch-up speed of DLI 10. In particular, if bit line 20 first exceeds threshold and the output 13 of skewed inverter 11 is first forced to ground, transistor 26' of pull-up circuit 19 is turned on, thereby also rapidly bringing (or holding) node 13' to $V_{DD}$. Since node 13' is HIGH, transistor 26 is turned off and does not pull node 13 up. Accordingly, pull-up circuit 19 increases the speed at which latch-up occurs.

It will be assumed for the present that MOP input 28 is at HIGH logic level so that transistors 30, 30', 31 and 31' are off and the second pull-up circuits 29, 29' are not operational. Second pull-up circuits 29, 29' are used to restore the third or reset state of the DLI at the conclusion of a read or write operation, as will be described in detail below.

It will also be understood by those having skill in the art that symmetrical inverter 16, 16' may be used to provide an output 27, 27' for the DLI which is a TRUE output (as opposed to a COMPLEMENT output) of the sensed signal. In other words, if the voltage in bit line 20 increases faster than 20', the latchup will force output 27 HIGH and 27' LOW. It will also be understood that inverters 16, 16' should have a symmetrical voltage transfer function so that they latch up rapidly when output nodes 13, 13' of the skewed inverters change state.

Referring now to FIGS. 3A-3D, the above described operation is illustrated. Voltage wave forms for the bit lines 20 and 20' and the outputs 27, 27' of the skewed inverters 11, 11' are shown. As shown in the first time interval for FIGS. 3A-3D, when the input on bit lines 20, 20' are below about one volt, the outputs 27, 27' remain at ground. However, as shown in the first time interval of FIG. 3A, when the voltage on bit line 20' is greater than about one volt and exceeds the voltage on bit line 20 by about two millivolts, line 27' rapidly latches to 5 volts and the slight rise in line 27 is immediately suppressed by the feedback condition. During a data read operation latchup occurs in about 1.65 nanoseconds from the start of the word pulse, using 0.8 micron groundrules. The second time interval of FIGS. 3A-3D illustrates the latchup of output 27 in response to the voltage on bit line 20 being higher than that of bit line 20'. After sensing of the stored data occurs, the voltage on both outputs are rapidly brought to ground by operation of the MOP input 28 which will be described below.

MEMORY ARCHITECTURE INCORPORATING THE DLI

Having described the design and operation of the DLI, a high speed, low power, high density memory architecture which uses the DLI will now be described. This architecture will be described relative to an SRAM, however it will be understood by those having skill in the art that the architecture may also be used in a DRAM.

Figure 4A:
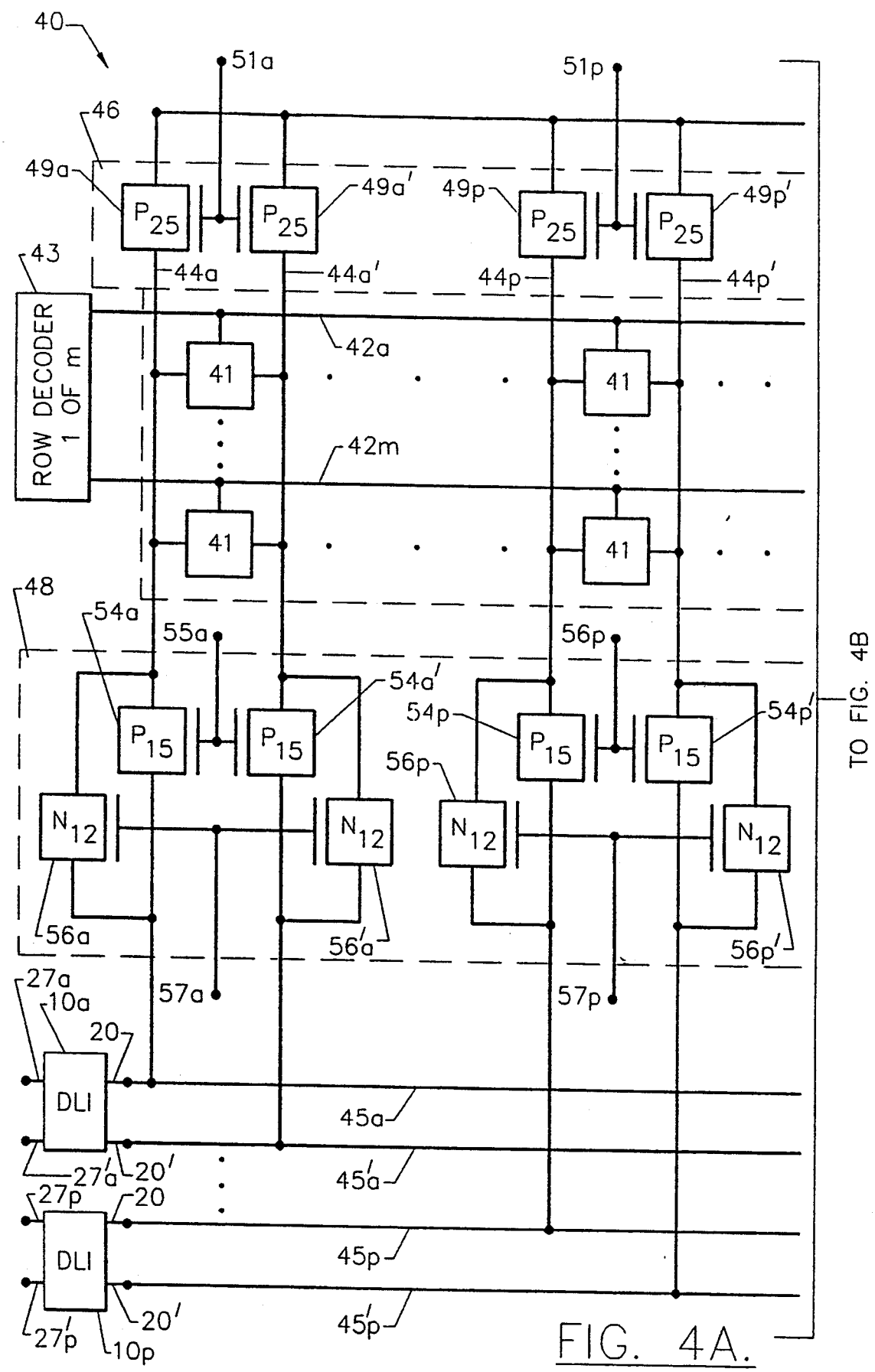
FIGS. 4A and 4B, which form FIG. 4 when placed adjacent one another as indicated, illustrate a block diagram of a random access memory architecture according to the invention incorporating the Differential Latching Inverter of FIG. 1.
Figure 4B:
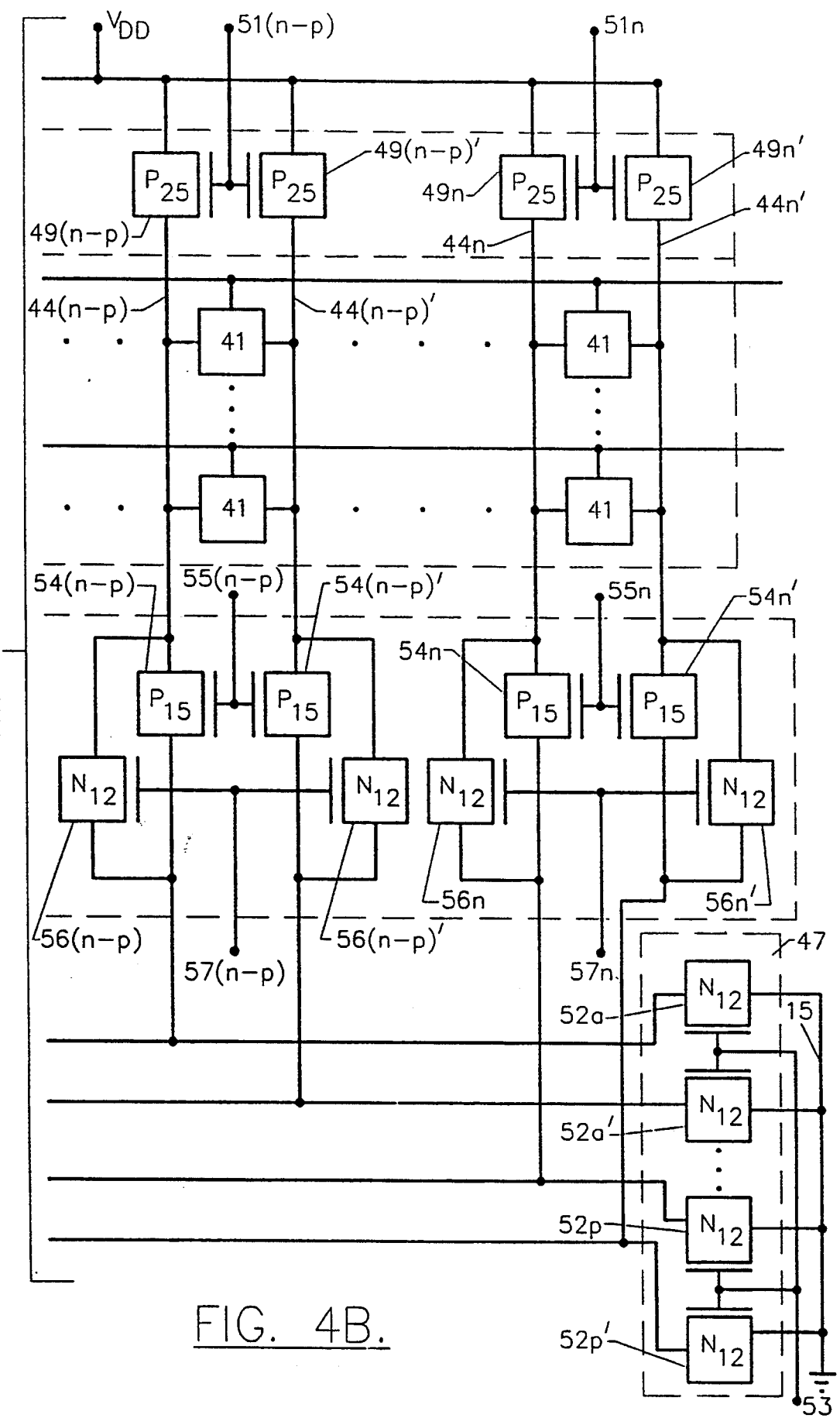

Referring now to FIGS. 4A and 4B, which are placed together as indicated to form FIG. 4, random access memory (RAM) 40 comprises an array of RAM cells 41. It will be understood by those having skill in the art that RAM cells 41 may be SRAM cells or DRAM cells, and may use cell designs well known to those having skill in the art. As illustrated in FIG. 4, RAM cells 41 are configured in an array of m rows and n columns. For example, in a 128 k bit RAM, 256 rows and 512 columns of RAM cells may be used. As also shown, m word lines 42a–42m are coupled to a one-of-m row decoder 43 for accessing one of word lines 42a . . . 42m. As also shown in FIG. 4, n pairs of bit lines 44a, 44a'–44n, 44n' are connected to the respective n rows of the array. As will be described below, two sets of bit lines are used in RAM 40, so that bit lines 44 are referred to as the "primary" bit lines.

Still referring to FIG. 4, it may be seen that p pairs of "signal" bit lines 45a, 45a–45p, 45p' are provided, with every path pair of primary bit lines 44 being connected to a respective one of the signal bit lines 45. In the example shown herein, p=16, i.e. 16 pairs of signal bit lines 45, 45' are provided, with every 16th column being connected to a respective one of the bit lines. In other words, bit line pairs $44_1$, $44_1'$, $44_{17}$, $44_{17}'$ . . . $44_{597}$, $44_{597}'$ are connected to signal bit lines 45a, 45a', and bit lines $44_{16}$, $44_{16}'$ . . . $44_{32}$, $44_{32}'$ . . . $44_{512}$, $44_{512}'$ are connected to signal bit line pair 45p, 45p'. The signal bit lines are generally orthogonal to the primary bit lines.

The choice of the number of signal bit line pairs depends on several factors. In particular, it has been found that the total capacitance which loads the primary bit lines 44 should be equal to or greater than the total capacitance loading the signal bit lines 45. The total capacitance which loads the signal bit lines 45 is primarily due to the diffusion capacitance of the coupling transistors which couple the primary and signal bit lines, as described below. It has been found that this loading capacitance should be minimized to achieve the maximum memory clock rate and minimum data access time and is inversely proportional to the number of DLI 10 used to configure the system. Finally, the relationship between m (the number of rows), n (the number of columns), and p (the number of DLIs) will also depend on the overall configuration of the RAM 40.

Continuing with the description of FIG. 4, a DLI 10a... 10p is connected to a respective signal bit line 45a... 45p. First, second and third coupling means, 46, 47 and 48 respectively, are used to selectively couple the primary bit lines 44 to the first reference potential 14 ($V_{DD}$), to selectively couple the signal bit lines 45 to the second reference potential 28 (ground), and to selectively couple the primary bit lines 44 to the signal bit lines 45. In particular, the first coupling means comprises n pairs of P-channel transistors 49a, 49a'–49n, 49n' for coupling a respective primary bit line 44a, 44a'. . . 44n, 44n' to $V_{DD}$ under control of gate inputs 51a–51n. Second coupling means 47 comprises p pairs of N-channel FETs 52a, 52a'–52p, 52p', each of which couples a respective signal bit line 45a, 45a'–45p, 45p' to ground 28 under control of gate 53. Finally, third coupling means 48 is seen to include P-channel transistors 54a, 54a'–54n, 54n' for coupling a primary bit line 44a, 44a'–44n, 44n' to a respective signal bit line 45a, 45a'–45p, 45p' under control of gate 55a–55n. An N-channel transistor 56a, 56a'–56n, 56n' also couples a respective primary bit line 44a, 44a'–44n, 44n' to a respective signal bit line 45a, 45a'–45p, 45p' under control of gates 57a–57n.

As will be seen from the operational description below, the first coupling means 46 couples the primary bit lines to $V_{DD}$ during the idle operation and during the read operation and decouples at least one of the primary bit line pairs from $V_{DD}$ during a write operation. The second coupling means 47 couples the signal bit lines to ground during the idle operation and decouples the signal bit lines from ground during a read operation and a write operation. The third coupling means 48 couples the primary bit lines to the signal bit lines during a read and write operation and decouples the primary bit lines and signal bit lines from one another during an idle operation. In particular, P-channel transistors 54 couple the primary bit lines to the signal bit lines during read operation and N-channel transistors 56 couple the primary bit lines to the signal bit lines during a write operation.

OPERATION OF THE RANDOM ACCESS MEMORY

The detailed operation of the random access memory 40 (FIG. 4) will now be described. The idle state will first be described followed by the read state and then the write state.

During the idle state, a LOW logic level is provided to gates 51 of first coupling means 46 to turn all of transistors 49 on and thereby place the primary bit lines 44 at the power supply level $V_{DD}$. At the same time, a HIGH logic level is provided to input 53 to turn on second coupling means 47, and thereby couple all of the signal bit lines 45 to ground. A high logic level is applied to inputs 55 and a low logic level is applied to inputs 57 to thereby turn transistors 54 and 56 off and thereby decouple the primary bit lines 44 from the signal bit lines 45. Finally, since all of the signal bit lines 45 are at ground, all of the DLIs 10 are in their third or idle state with all of the outputs 27 and 27' being at ground potential. No DC power is consumed by the circuit during the idle state.

During a read operation, row decoder 43 selects one of word lines 42a. . . 42m to access a particular row of RAM cells 41. A logic LOW signal is applied to input 53 to turn second coupling means 47 off to thereby decouple signal bit lines 45 from ground. Although not coupled to ground, the capacitance of the signal bit lines maintains the signal bit lines near ground potential. A logic LOW level is maintained at gates 51 to thereby continue to couple the primary bit lines to $V_{DD}$. A column decoder, not shown in FIG. 4, provides a LOW logic level to a selected one of inputs of 55a–55n depending upon the column to be read. This turns on the appropriate transistor pair 54, 54' and causes current to flow between the associated primary bit lines 44, 44', and the signal bit lines 45, 45'.

It should be noted that FETs 54 are connected as current controlled devices, the current through which is controlled by their source voltage. Accordingly, the primary bit line which is at a higher voltage will produce more current to pull up the signal bit lines, than the primary bit line which is at a lower voltage. Since the selected RAM cell current tries to discharge one or the other side of the primary bit lines 44, 44', the voltage of one of the primary bit lines drops from $V_{DD}$ at a rate faster than the other, depending on the state of the selected RAM cell 41. Current flows between the selected primary bit line pair 44, 44', and the signal bits lines 45, 45', causing a difference to occur in the voltage ramp-up rate on the signal bit line pair 45, 45'. When the ramp-up voltage on one or the other of the signal bit lines 45, 45' exceeds the threshold of the DLI 20, the output Of the DLI is rapidly latched to a ONE or ZERO. In other words, either output 27 goes HIGH and 27' goes LOW or output 27' goes HIGH and 27 goes LOW.

As described in detail below, the outputs 27 of all of the DLIs may be gated (ORed) together because all of the DLIs which are not active are in their third state. Accordingly, the output of the activated DLI may be placed in a read register and provided as the chip output, as described in detail below.

Once a DLI has been latched and the data has been read, the RAM is rapidly restored to the idle state by activating the MOP input 28 (FIG. 1) with a logic LOW signal, to immediately pull the DLI back to its idle state. At the same time, once the data has been read, a HIGH signal is applied to input 53 to thereby reactivate second coupling means to return the signal bit lines to ground and a HIGH signal is applied to input 55 to decouple primary bit lines 44, 44' from signal bit lines 45, 45'. Once this has occurred, the MOP input 28 is again brought HIGH to disable the second pull-up circuit 29 because the DLI is now in the reset state. The operation of the control circuits for restoring the RAM after a read operation will be described in detail below.

From the above description it may be seen that the read operation is self-timing. In other words, once the data has been read, the RAM resets itself to the idle state without the need for a reset clock pulse. Accordingly, speed is not hampered by clocking requirements, and operations can occur as fast as possible consistent with reliable reading of data. The DLI also provides reliable reading of data at high speed, so that high speed operation of RAM 40 may be obtained.

In the write operation, a selected one of inputs 51a–51n is placed HIGH by a column decoder to thereby deactivate the associated first coupling means 46 and thereby decouple the associated pair of primary bit lines 44, 44′ from $V_{DD}$. A HIGH logic signal is applied to select one of inputs 57a–57n to thereby couple the selected primary bit lines 44, 44′ to the appropriate signal bit lines 45, 45′. One of the signal bit lines is clamped at LOW level which thereby forces one of the selected primary bit lines to ground. This forces one side of the selected RAM cell to ground and causes the other side to go up thereby storing data in the selected cell. During the write operation, transistors 54 are maintained off and transistors 52 are turned off to decouple the signal bit lines from ground. After the write operation is successfully performed, the written data is automatically sensed by the associated DLI, and the memory is reset as described above for the read operation. The operation of the control circuits for restoring the RAM after a write operation will be described in detail below.

Having described the general operation of the RAM of the present invention, the detailed circuitry for controlling the operation of the RAM will now be described.

READ AND WRITE CONTROL CIRCUIT

Figure 5:
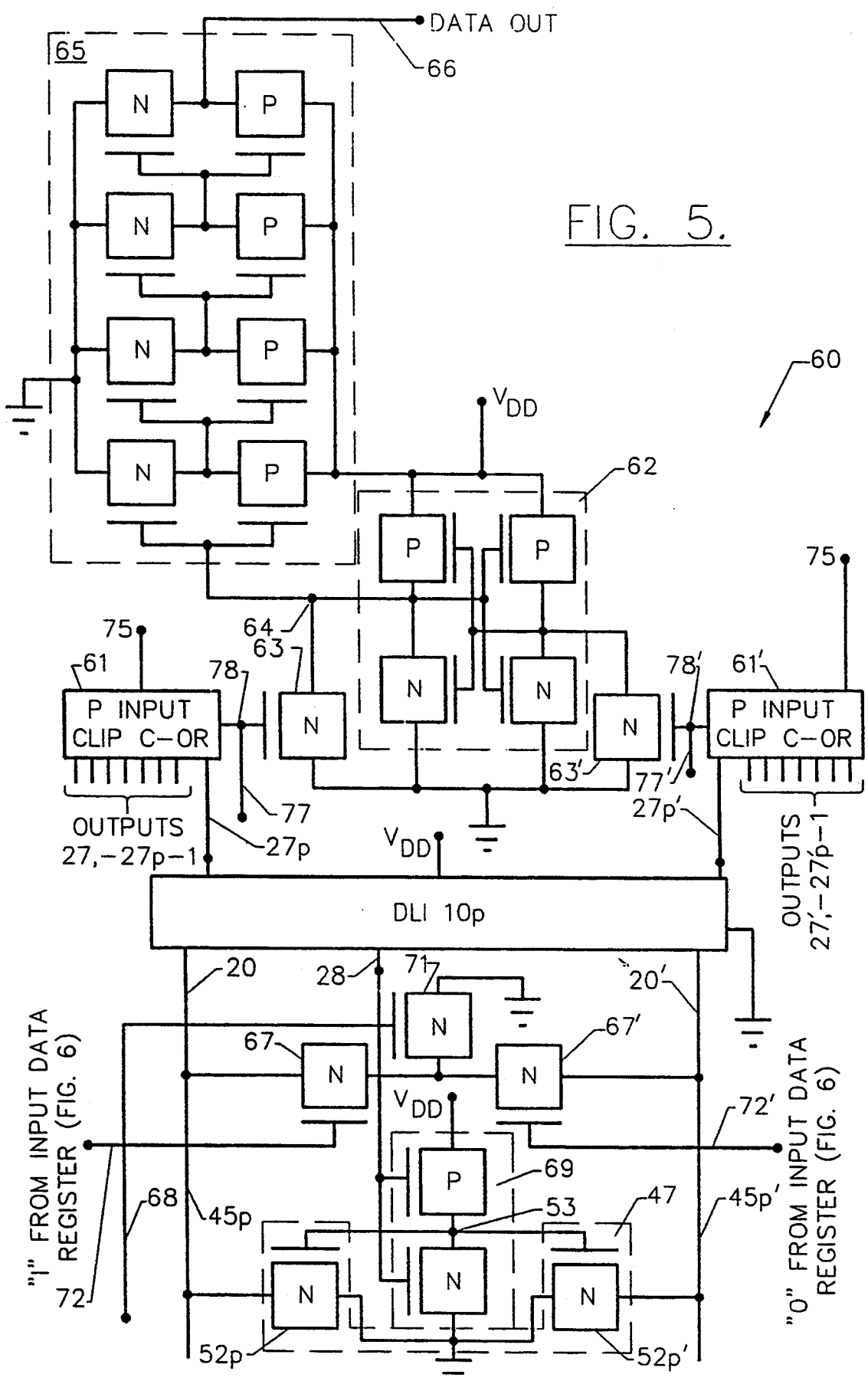
FIG. 5 illustrates a schematic circuit diagram of read and write control circuits for a random access memory according to the present invention.

Referring now to FIG. 5, there is illustrated a schematic circuit diagram of the circuit for coupling each of p signal bit line pairs 45a, 45a′–45p, 45p′ to a DLI 10a–10p and coupling the outputs 27, 27′ of each DLI to a data output register. Circuitry for referencing the signal bit line pairs 45a, 45a′–45p, 45p′ to ground is also shown along with circuitry to control the binary value written into a selected RAM cell 41 from a given signal bit line pair.

Referring again to FIG. 5, each of the output terminals 27, 27′ of a DLI 10, for example, output terminals 27p, 27p′ of DLI 10p, is shown coupled to a p-input Complementary Logic Input Parallel Clocked OR gate 61, 61′ also referred to as a CLIP-C OR gate. The CLIP-C OR gate is described in detail in copending application Ser. No. 07/648,219 entitled *Complementary Logic Input Parallel (CLIP) Logic Circuit Family* by the present inventor Albert W. Vinal and assigned to the assignee of the present invention, the disclosure of which is incorporated herein by reference. Conventional cascaded OR gates may also be used; however, as described in the aforesaid copending application, a single CLIP-C OR gate can handle large numbers of inputs at high speed and low power.

As shown, outputs $27_1$–$27_{p-1}$ and $27_1'$–$27_{p-1}'$ of the remaining DLI circuits $10_1$–$10_{p-1}$ drive other input terminals of these CLIP-C OR gates. The logic output 78, 78′ of each CLIP-C OR gate drives the input of a transfer memory (TRAM) output cell 62 comprising a pair of cross-coupled complementary inverters, via coupling transistors 63, 63′. As shown, if output 27p of DLI 10p is HIGH, then N-channel transistor 63 is turned on and the left side of TRAM cell 62 is driven LOW. Alternatively, if output 27p′ of DLI 10p is HIGH, then N-channel transistor 63′ is turned on via CLIP OR gate 61′ and the output of TRAM cell 62 is HIGH. The clock inputs 75, 75′ to CLIP-C OR gates 61, 61′ will be described below, in connection with FIG. 7. The outputs 78, 78′ of OR gates 61, 61′ are also provided to reset circuit 88 of FIG. 7, via lines 77, 77′ as described below.

As shown, the output 64 of TRAM cell 62 is coupled to a ring segment buffer 65 having four stages, to allow the output of the TRAM cell to rapidly drive off-chip or on-chip load capacitance with a specified voltage rise and delay time. The ring segment buffer design is described in Application Ser. No. 07/497,103 entitled *High Speed Logic and Memory Family Using Ring Segment Buffer* by the present inventor Albert W. Vinal assigned to the assignee of the present invention and now U.S. Pat. No. 5,030,853, the disclosure of which is hereby incorporated herein by reference. The output 66 of the ring segment buffer 65 is the digital data output of the memory array.

Accordingly, during a read operation, one output of one DLI will go HIGH, as a function of the voltage ramp differential on the associated signal bit line. One input to OR gate 61, or one input to OR gate 62 will thereby go HIGH. One of OR gate outputs 78 or 78′ will thereby go HIGH, thereby setting or resetting TRAM 62. The output of TRAM 62 drives ring segment buffer 65, to thereby provide a HIGH or LOW data input. The ring segment buffer 65 may be configured as a tristate driver, under control of a chip select signal, in order to accommodate a plurality of RAM outputs on a single bus.

Still referring to FIG. 5, when the RAM is in its idle state, the gates of transistors 52p, 52p′ are HIGH because the MOP gate 28 is LOW causing the output 53 of complementary inverter 69 to be HIGH. The gate input terminals of the transistors in inverter 69 are driven by the MOP gate 28. Generation of the MOP signal is described in detail below. In the absence of a MOP gate 28, each bit line of all signal bit line pairs is continually referenced to ground by transistors 52, 52′. Voltage referencing is terminated only when a MOP gate is active.

During a write interval, transistors 67, 67′ and 71 provide means for controlling the binary state written into a selected RAM cell. A RAM cell selection occurs at the intersection of a selected word line 42 and a selected primary bit line pair 45 (FIG. 4). The gate input terminals of transistors 67, 67′, are coupled through a logic AND gate (not shown), to the ONE and ZERO output terminals respectively, of a binary data input register described below in connection with FIG. 6.

During a write interval, the gate input 68 to transistor 71 is brought HIGH, thereby clamping the common source connection between transistors 67 and 67= at ground potential. Transistor 71 allows one or the other bit line of a signal bit line pair to be clamped to ground, depending on whether the gate voltage is applied to transistor 67 or 67′. If the data input register contains a binary ONE, then transistors 67 and 71 conduct, clamping the ZERO side 20 of the signal bit line pair to ground. At the same time, the ONE side of the signal bit line pair 20′ is not clamped to ground. The opposite conditions exist if the data input register produces an UP level voltage at the gate of transistor 67′ and a DOWN voltage at the gate of transistor 67.

Figure 6:
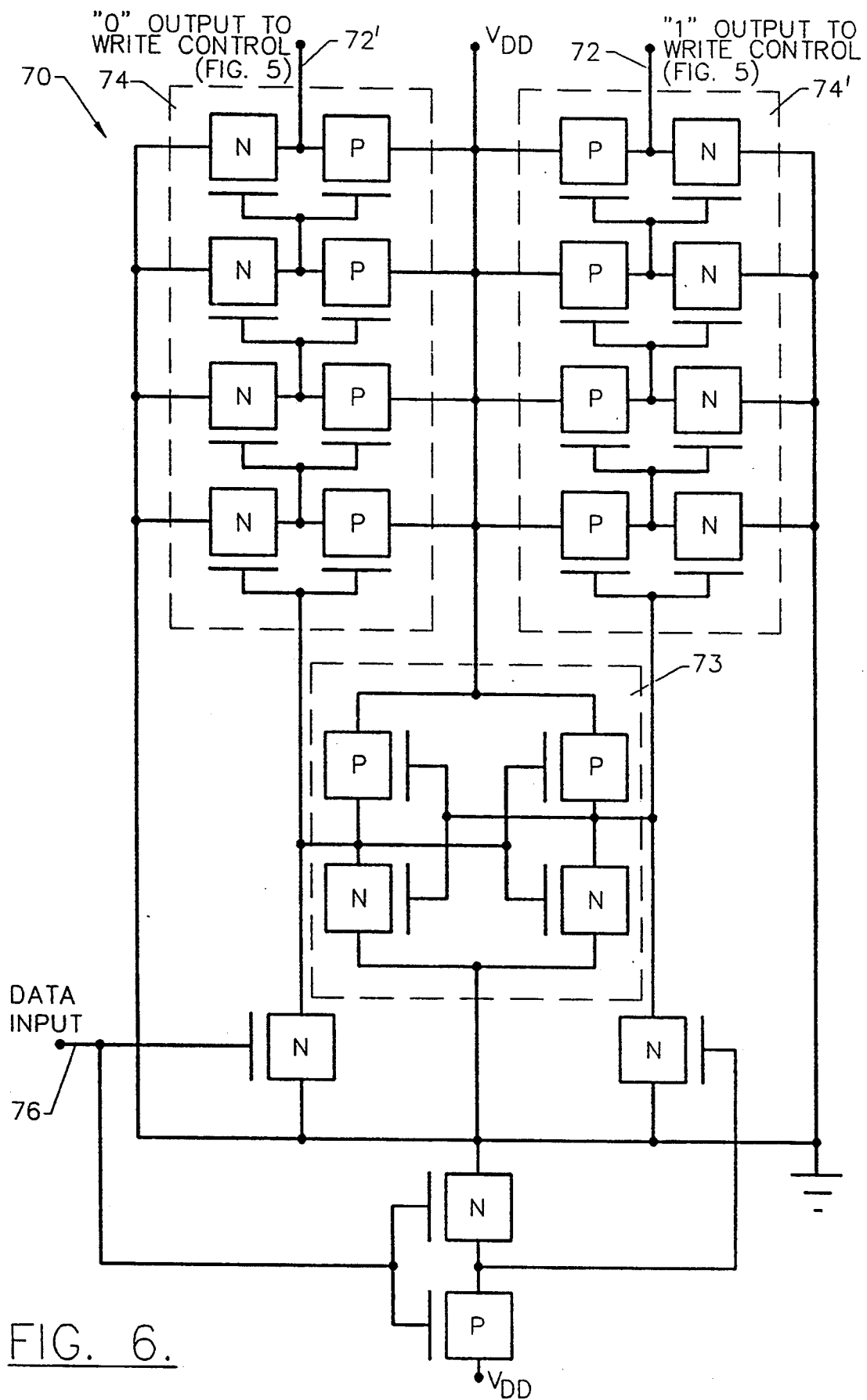
FIG. 6 illustrates a schematic circuit diagram of a data input register for a random access memory according to the present invention.

FIG. 6 illustrates the data input register 70. As shown, a data input 76 to the RAM array is coupled to a transfer memory output cell 73, the ZERO output of which is coupled to a first ring segment buffer 74 and the ONE output of which is coupled to a second ring segment buffer 74′ to produce a ZERO output 72′ or a ONE output 72 which is coupled to the input 72, 72′ of FIG. 5. The ring segment buffer is described in the aforesaid application serial number 07/497,103. It allows a given load to be driven, with a predetermined rise time, and minimum delay.

The data input register circuit 70 allows a slow rise time input to be converted into fast rise time TRUE and COMPLEMENT outputs, with a minimum delay. Accordingly, the circuit of FIG. 6 may also be used to buffer slow rise time RAM inputs (such as address or select inputs), for use in the RAM array.

Continuing with the description of the write operation, and referring again to FIG. 4, assume that a particular primary bit line pair 44, 44' is decoded and activated by bit line decoder. Transistors 49, 49' of this bit line pair are turned off during a write cycle by selecting the appropriate input 51 via the bit line decoder. Appropriate decoded coupling transistors 56, 56' are turned on. One side or the other of a signal bit line pair 45, 45' is clamped to ground by the data input register via transistors 67, 67' (FIG. 5). This causes the associated transistor 56, 56' (FIG. 4) to pull down one primary bit line 44, 44' towards ground potential. The unclamped signal bit line rapidly rises in voltage until the sum of this voltage and the drop in the primary bit line voltage equals the power supply voltage $V_{DD}$. Preferably, the RAM cell design allows the increase in the unclamped signal bit line voltage to be equal to the decrease in the primary signal bit line voltage.

During a write cycle, one of m word lines 42 is also turned on by row decoder 43 (FIG. 4), applying gate voltage to the pass transistors of the RAM cell. The selected RAM cell pass transistors thereby couple the potential of the primary bit lines to or from a common signal point in the RAM cell. During write, the primary bit line that is driven to near ground potential sets the state of the selected RAM cell. When the state of the selected RAM cell is set, the MOP gate generator described below is terminated along with the write gate 68 (FIG. 5), and transistors 49, 49' are turned on to recharge the primary bit lines 44 back to power supply voltage $V_{DD}$. Simultaneously, transistor 71 of FIG. 5 is turned off and transistors 52, 52' are turned on allowing both signal bit lines 45, 45' to be returned to ground potential.

During the write interval, the rising potential of the unclamped signal bit line rapidly causes the associated DLI to respond to this signal voltage when it exceeds the threshold voltage of the DLI. The binary state written into the RAM cell is therefore also transmitted to the output TRAM 62 (FIG. 5) and presented to the output 66, as described above for the read operation, allowing error detection functions to be performed. It will be understood by those having skill in the art that the simultaneous sensing of the signal voltage written into the selected RAM cell during a write operation allows the RAM to terminate the write operation without the need for external clocking. Resetting of the RAM after a write or read operation will be described below.

MEMORY OPERATION (MOP) TIMING CONTROL

Figure 7:
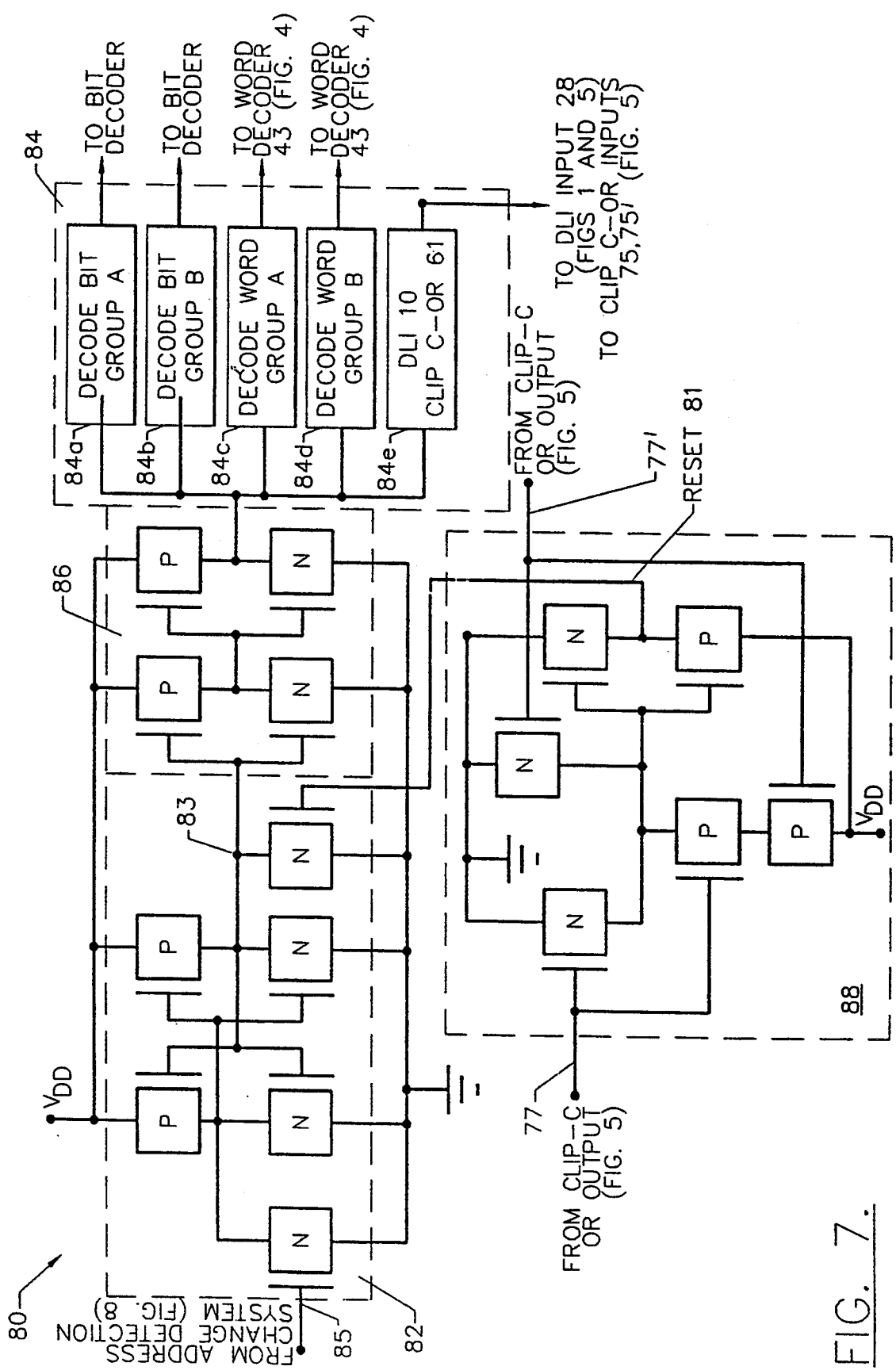
FIG. 7 illustrates a schematic circuit diagram of timing control circuitry for a random access memory according to the present invention.

Referring now to FIG. 7, the circuitry for controlling the timing of a read and write operation, collectively referred to as a memory operation (MOP) is shown. This circuitry generates a MOP signal which is used at various portions of the RAM architecture as previously described. Activation of the MOP signal initiates a read or write operation, and deactivation of the MOP signal terminates the read or write operation, as described below. By generating an internal MOP signal, and using the MOP signal to control the timing of read and write operations, the memory operation is independent of an external clock. System power is dissipated only during the MOP interval, and is primarily related to the switching power; i.e. it is proportional to capacitance times voltage squared times the switching frequency. When the MOP gate is off, the only power dissipated by the system is due to transistor leakage current. None of the circuits within the system dissipate standby power when the memory is not functioning in a read or write mode, regardless of whether the chip select is active or not. A low power, high speed memory is thereby provided.

Moreover, since the memory creates its own timing signals for read and write operations, all timing and logic functions within the memory are automatically temperature compensated, allowing the RAM to reliably operate over a broad range of temperatures. At high temperatures, the maximum access rate is lowered from room temperature due to the reduced current capabilities of the transistors. At low temperatures, the maximum access rate is increased above the room temperature value due to the increased current capabilities of the transistor.

Referring again to FIG. 7, the read/write operation timing circuitry 80 is controlled by a TRAM cell 82 comprising a pair of cross-coupled inverters and a pair of pass transistors of well known design. This TRAM cell is turned on and the output 83 thereof goes HIGH when an address change detection system issues an address change detection clock pulse on input 85, upon detecting a change in the input address. This TRAM cell is also turned on when a chip select transition going active, or a write enable transition going active, is detected by a TDLU discussed below in connection with FIG. 8. The address change detection system is described in connection with FIG. 8 below.

The output 83 of RAM cell 82 is coupled to a ring segment buffer 86, the output of which is coupled to a group of ring segment buffers 84. These ring segment buffers provide the mechanism for driving the total load capacity associated with the clock lines and the system logic cells such as the bit and word address decoding drivers and the DLI sensing systems. These ring segment buffers also provide the proper delay for timing the various internal circuits in the RAM, as described below.

As shown in FIG. 7, five delay ring segment buffers 84a–84e are used, however other numbers of ring segment buffers may be used in other memory architectures. Ring segment buffers 84a and 84b are used to clock the bit decoders (not shown) for the primary bit line pairs, and ring segment buffers 84c and 84d are used to clock the row decoder 43 (FIG. 4). The input stage of each of ring segment buffers 84a–84d comprise a two input CMOS NAND gate. One of the input gate electrodes of this NAND gate is driven by the appropriate output of the high order bit of the m bit word and n bit address registers. The other input is driven by the MOP gate. This NAND gate permits segmenting the total number of row and column selects of the RAM into at least two halves. The first half contains m/2 low order addresses and n/2 high order addresses. Accordingly, clocking in high order groups is inhibited when addressing low order group selection and vice versa.

This procedure eliminates dissipating unnecessary switching power during a read or write memory cycle and simplifies the design of the clock driver. However, it will be understood by those having skill in the art that the word and bit decode functions need not be divided into groups.

The output of delay ring segment buffer 84e is provided to the DLI input 28 (FIGS. 1 and 5) and to the clock inputs of the CLIP-C OR circuits 75, 75' (FIG. 5). Accordingly, after a predetermined period from the time an address change is detected, the DLI input 28 is activated and a clock pulse is applied to the CLIP-C OR gate. Application of the MOP input 28 to the DLI 10 of FIG. 1, allows the DLI to rapidly latch into one or the other binary state, without interference from the second pull-up circuit 29, 29'. Application of the MOP input to clocking inputs of the CLIP-C OR gates 75 provides a clock pulse for timing the output of the CLIP-C OR gate.

Still referring to FIG. 7, two input CMOS OR gate 88 is driven by the outputs 77, 77' of the p-input CLIP-C OR gates 61, 61' (FIG. 5). The reset output 81 of this OR gate resets TRAM 82 and thereby resets each ring segment buffer 84 after the predetermined delay of each ring segment buffer. After a RAM cell has been read (either during a read cycle or at the end of a write cycle) one or the other p-input CLIP-C OR gates 61, 61' (FIG. 6) will deliver a logic HIGH voltage at output 71 or 71', to signal completion of the intended operation. In other words, a DLI has properly stored a bit value which was read or has properly stored a bit value which was written to confirm that writing has taken place. When this event occurs, the MOP gate is no longer required and is automatically terminated by action of the MOP gate reset driver 88. All clock drivers subsequently shut down within the propagation delay time of the ring segment buffers 84.

In particular, ring segment buffers 84a and 84b shut down the bit decoders and ring segment buffers 84c and 84d shut down the word decoders 43 (FIG. 4). Ring segment buffer 84c terminates the MOP signal which shuts off CLIP-C OR gates 61, 61' (FIG. 5) and also causes second pull-up circuits 29, 29' (FIG. 1) to rapidly bring DLI 10 to its reset state (both inputs at ground). A memory operation (read or write) is thereby automatically terminated.

From the above description it may be seen that the feedback shutdown control of the MOP gate generator automatically accommodates broad thermal environments that the RAM may experience, since MOP shutdown occurs only after a read or write function completion has been detected by the DLI. In other words, the MOP gate is initiated when either an address change, chip select or write enable is detected, indicating that a read or write operation is to begin, and is automatically terminated once the proper read or write function has been completed. When neither a write or read function is required, the MOP gate is off and remains off until turned on again by the output of the change detector. The address change detector operation will be described in the next section in connection with FIG. 8.

ADDRESS CHANGE DETECTION SYSTEM

Figure 8:
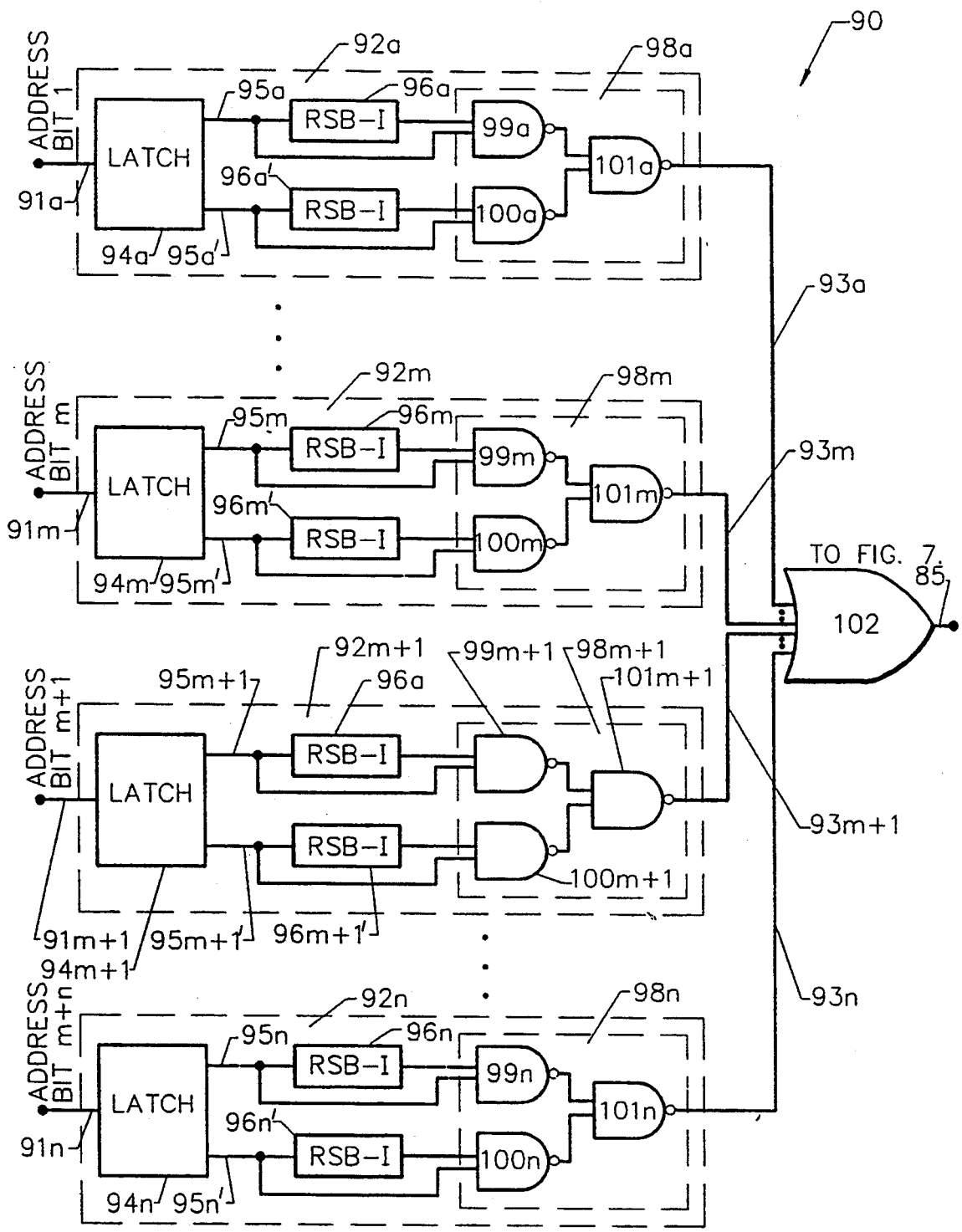
FIG. 8 illustrates a block diagram of an address change detection circuit according to the present invention.

In general, a random access memory can begin a memory operation (i.e. a read or a write operation) by detecting a change in at least one of the input address bits. In a conventional address change detection system, the time required to detect a change in the input address can significantly slow the memory cycle time. According to the invention, an improved address change detection system detects a change in an input address in minimum time. The system uses a transition detection logic unit (TDLU) which is shown in FIG. 8. Prior to describing the TDLU, a conventional address change detection system will be described.

There are three basic elements required in a conventional address change detection system. The first is a latch which is used to increase the rise time of the input address bit. Using the example of a memory with m rows and n columns, a total of m+n latches are required to compare the m+n latches allow comparison of the m+n address bits. The second component of a conventional address change detection system is an exclusive OR circuit for each of the latches. The exclusive OR circuit will provide an output whenever the previous address bit and the present address bit are different. Finally, all of the exclusive OR gate outputs are ORed together, to provide a HIGH logic level when any of the exclusive OR gates are HIGH. A change in the address is thereby detected.

The above described exclusive OR and OR logic is responsible for most of the delay in detecting the change in the input address, due to the large number of inputs which have to be ORed together. For example, for a 64 $k$ bit RAM, the total number of address bits (m+n) is 16, and for a 256 $k$ bit RAM the total number of address bits (m+n) is equal to 18. Using conventional CMOS gates, a cascaded tree of CMOS gates is required to provide the function of a 16 or 18 input OR gate.

For example, using conventional three input CMOS OR gates, a nine-OR gate tree is necessary to OR 18 inputs. Six OR gates accept the total of 18 inputs at a first level of the tree. The outputs of each group of three gates are provided to an OR gate at a second level. Two OR gates are used in the second level to accept all six outputs from the first level. Finally, at a third level, one OR gate combines the output of the two second level OR gates. Propagation delay time through this logic tree is excessive and requires many transistors to perform the function.

Referring now to FIG. 8, a block diagram of the address change detection system 90 of the present invention will now be described. As shown, the address change detection system comprises m+n Transition Detection Delay Units (TDLU) 92a-92n. A respective address bit 91a-91n is provided as the input to a respective transition detection delay unit 92a-92n. The respective outputs 93a-93n of the transition detection delay units 92a-92n are provided as inputs to a single m+n input Complementary Logic Input Parallel (CLIP) OR gate 102. The output 85 of CLIP OR gate 102 provides an address change detection signal which is provided to the MOP generating circuit 80 of FIG. 7. The design and operation of a complementary logic input parallel OR circuit 102 is described in the aforementioned application Ser. No. 07/648,219.

Each TDLU 92 delivers a clock pulse to the appropriate input of the CLIP OR gate 102 when an address transition is detected on its input address line 91. One TDLU is coupled to the chip select latch and one TDLU is coupled to the write enable latch (not shown). Their outputs are also inputted to CLIP OR gate 102. The basic components of the TDLU are a latch 94a-94n, whose logical state is controlled by a single input signal line 91a-91n which is connected to the address inputs of the RAM chip. The ONE and ZERO outputs of the latch, 95a–95n and 95a'–95n' respectively, rapidly switch when a transition in the input signal 91 occurs and provides both the TRUE and COMPLEMENT function of the input signal. Identical ring segment buffers 96a14 96n and 96a'–96n' are coupled to the true and complement outputs 95a–95n and 95a'–95n' of the latches 94a–94n. As shown in FIG. 8, ring segment buffers 96 are delay ring segment buffers with an odd number of stages to provide an inverting delay ring segment buffer (RSB-I). The design and operation of a delay ring segment buffer is described in application Ser. No. 07/497,103. As described in this application, the delay property of the ring segment buffer is controlled by proper choice of channel length for the P- and N-channel transistors used to form the ring segment buffer inverters. The outputs of the ring segment buffers and the outputs of the latch are each connected to cascaded NAND gates 98a–98n as illustrated in FIG. 8, to form the output 93a–93n of the TDLUs 92a–92n.

FIG. 9 illustrates an alternative design for the TDLU 92. In this alternative design, noninverting delay ring segment buffers, consisting of an even number of inverter stages, are used. The latch outputs 95, 95' are cross-coupled with the ring segment buffer outputs in order to provide the proper inputs to the cascaded NAND gates 98. FIG. 10 illustrates the relationship between the input address bit 91 and the output 93 of each of the TDLUs 92, 92' of FIGS. 8 or 9. As shown, a positive going or negative going transition in an address bit 91 provides a clock pulse of a predetermined duration at the output 93. The duration of the clock pulse resulting from detecting a transition at the outputs of the latch, is controlled by the time delay designed into the ring segment buffers 96.

FIGS. 11A and 11B illustrate the truth tables for the TDLU 92 of FIG. 8 and the TDLU 92' of FIG. 9, respectively. Referring to FIGS. 11A and 11B, it may be seen that both configurations of the TDLU produce the same output function for the same input function.

The address change detection system of the present invention, is simple to construct and virtually eliminates propagation delay time required to detect a change in an input voltage function, and has broad functional application for high speed computer design philosophy. It will also be noted that the TDLU technology automatically accommodates the demands of the MOP gate generator for temperature effects.

Figure 12A:
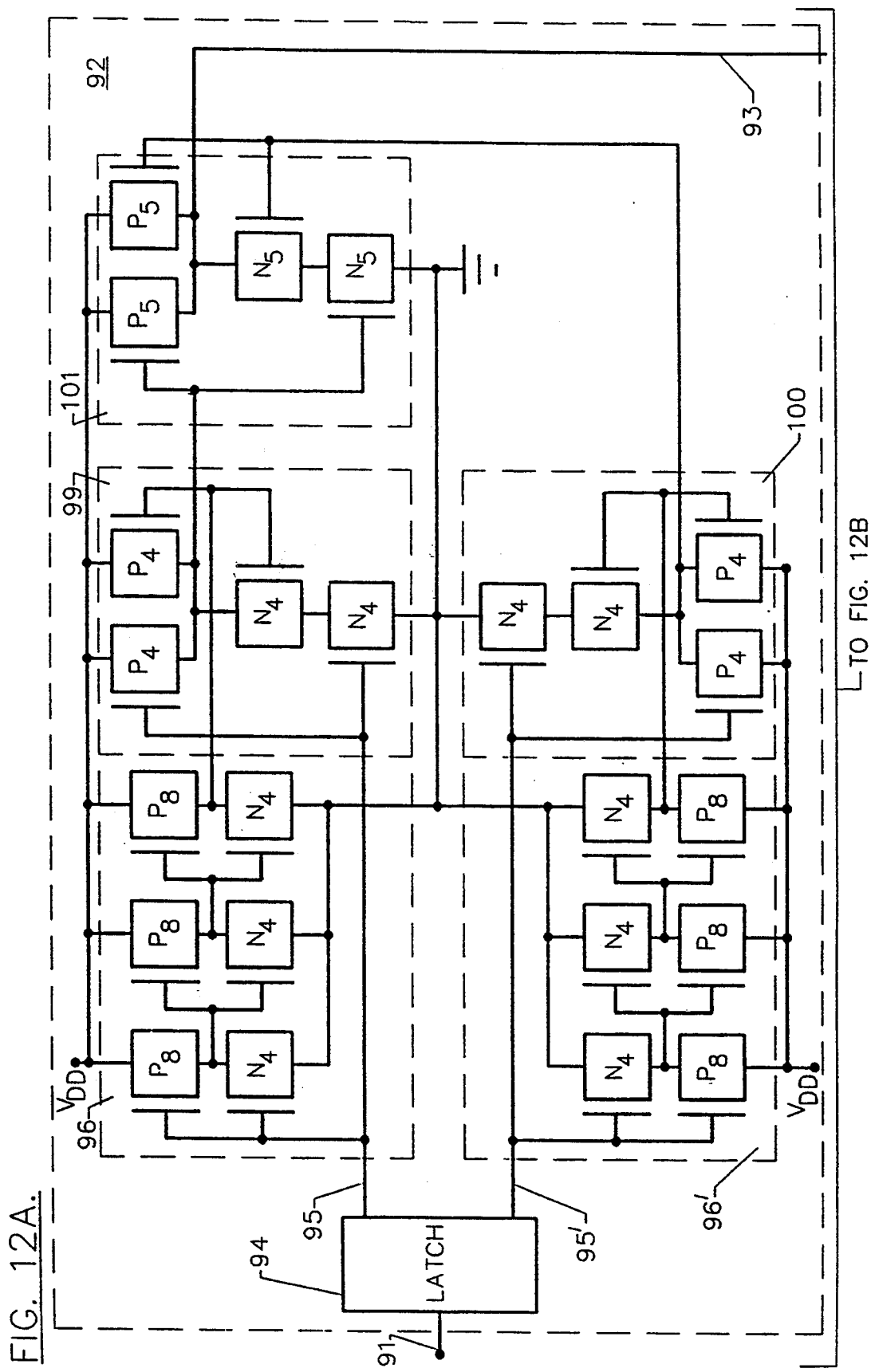
FIGS. 12A and 12B is a circuit schematic diagram of the address change detection circuitry of FIG. 9.
Figure 12B:
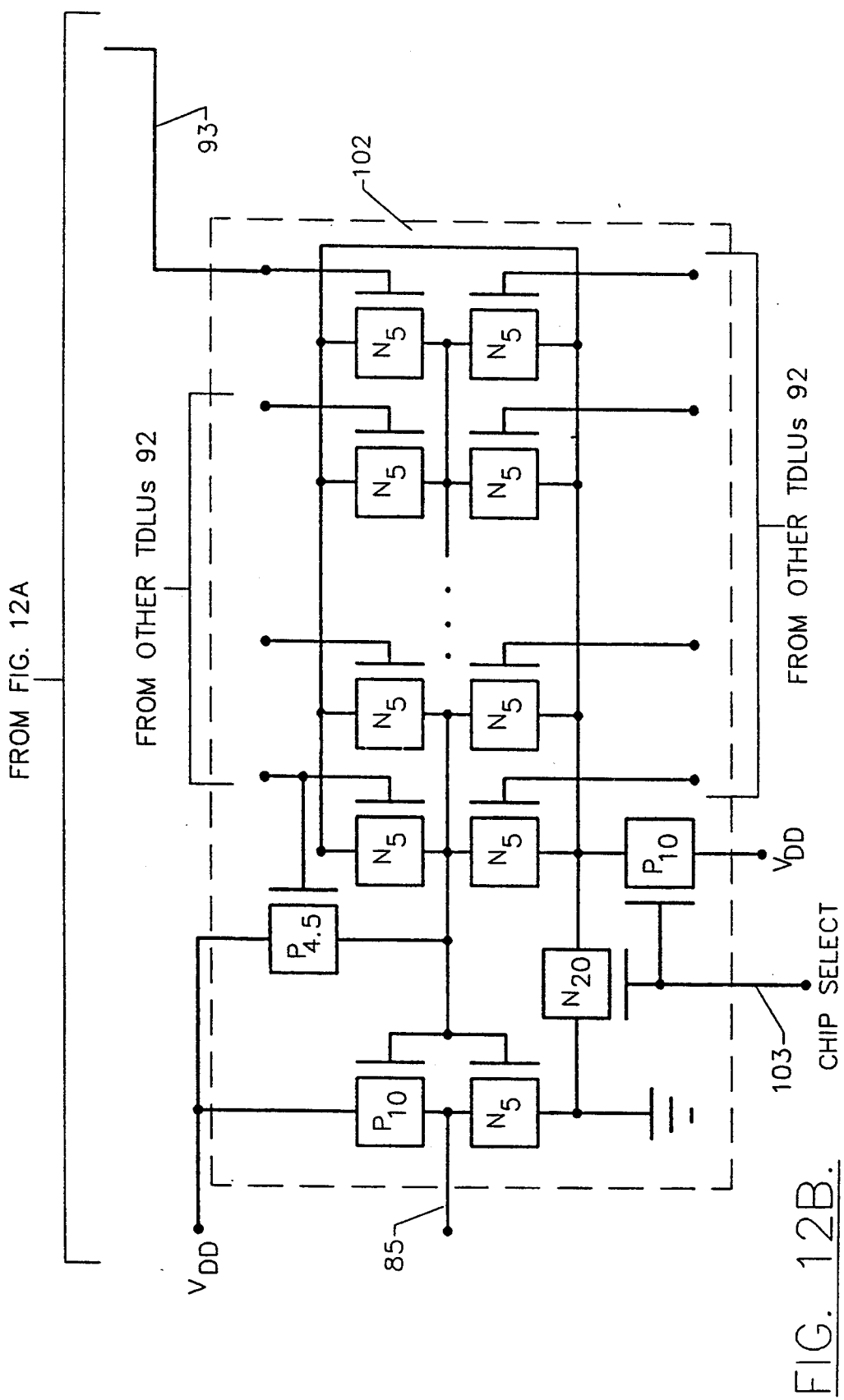

FIGS. 12A and 12B, which together form FIG. 12 as indicated, illustrate a circuit schematic diagram of the address change detection circuitry of FIG. 8. As shown, TRAM 92 includes latch 94 and a pair of three stage (inverting) ring segment buffers 96, 96'. Complementary Logic Input Parallel NAND gates 99, 100 and 101 are also shown. Assuming equal channel lengths, the relative channel widths of the respective transistors are shown within the respective transistors.

The output 93 from the transition detection delay unit 92 is provided as an input to multiple input CLIP OR gate 102. The corresponding outputs from the other transition detection delay units are also provided as inputs to the CLIP OR gate 102. Also provided as an input to the CLIP OR gate is a chip select input 103' so that the output 85 of CLIP OR gate 102 is at logic HIGH whenever an address change is detected and the RAM chip has been selected.

TIMING OF RAM OPERATION

Figure 13:
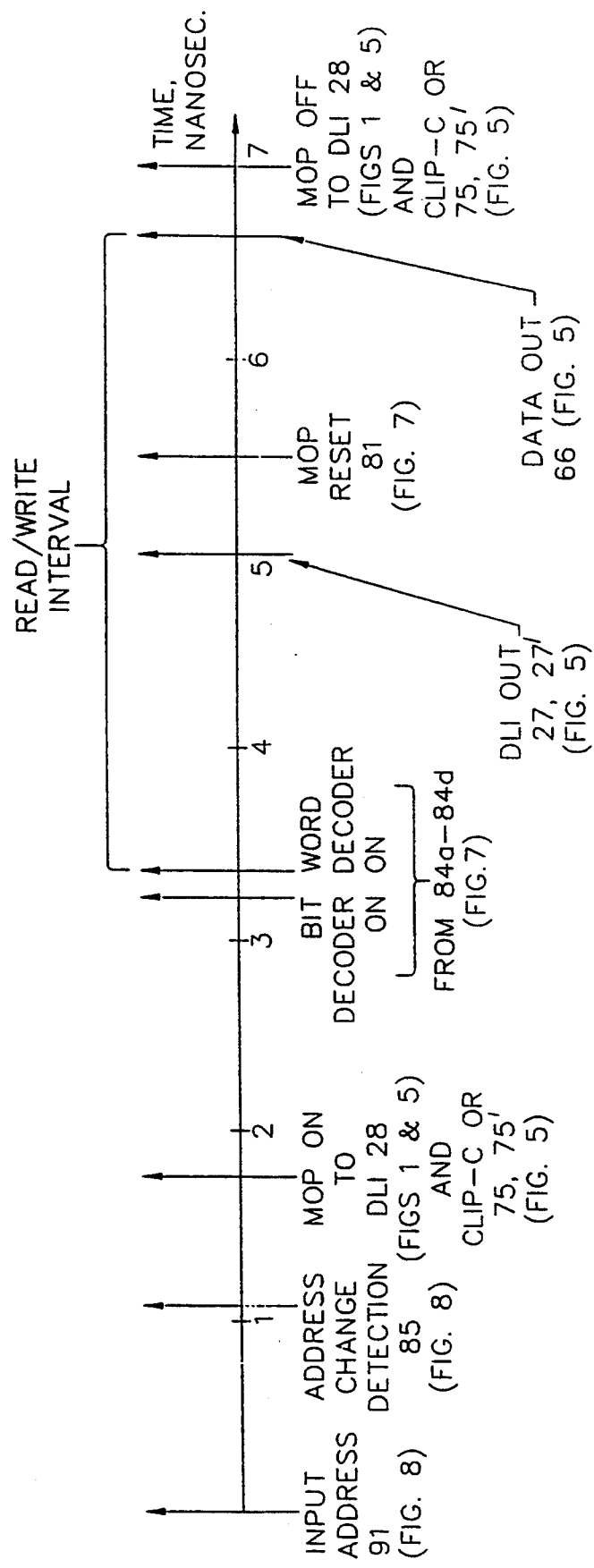
FIG. 13 is a timing diagram for a random access memory according to the present invention.

Having now described the individual components and the detailed operation of the present invention, an overview of the memory timing will now be described in connection with the timing diagram of FIG. 13. The time line of FIG. 13 is calibrated in nanoseconds and the values are based on simulations of the RAM of the present invention, with the FETs being fabricated using 0.8 micron groundrules.

The timing diagram begins at time equals zero, with a change on input address 91 of FIG. 8. The change in input address is detected and the output 85 of the address change detection system of FIG. 8 is produced after 1.1 nanoseconds. This output is provided to the timing circuit 80 of FIG. 7, and the output of ring segment buffer 84e produces the MOP signal after about 1.75 nanoseconds. At about 3.5 nanoseconds, the bit decoders and word decoders are clocked via the outputs of ring segment buffers 84a–84d of FIG. 7. Accordingly, the read or write interval begins after about 3.5 nanoseconds from the time the input address changed.

An output is produced on the DLI at just over five nanoseconds and the MOP reset signal 81 of FIG. 7 is produced shortly thereafter. The data out signal 66 in FIG. 5 is produced approximately 2.7 nanoseconds from the time the read/write interval began. The reset signal propagates through the ring segment buffers 84a–84e between five and six nanoseconds to turn off the CLIP-C OR gate 75, 75' of FIG. 5 and to activate the second pull-up circuit of the DLI via MOP input 28. Accordingly, after about seven nanoseconds, a new read/write cycle may start with a new change in the input address.

The random access memory of the present invention may also be operated in a unique write mode called "burst write". Burst write is achieved when the write enable is active, the chip select (103, FIG. 12) is active, and the transition detection delay unit output starts the memory cycle with each detected address change and the DLI output terminates the MOP gate. This burst write cycle can be used efficiently to fully load all or a part of the total memory in minimal time and with minimal power consumption.

From the above Description of a Preferred Embodiment, it will be understood by those having skill in the art that the Differential Latching Inverter, memory architecture, read and write control circuit, memory operation timing control circuit and address change detection circuit may be used independently to improve the operation of conventional random access memories. However, it will also be understood by those having skill in the art that these elements may all be incorporated together into a unique random access memory design which exhibits high speed and low power dissipation. For example, a computer simulation of a 128 kilobit SRAM array using these circuits and implemented in 0.8 micron MOSFET technology exhibits a read or write cycle time of eight nanoseconds, and a power dissipation of 200 milliwatts operating at 125 mHz, at room temperature. The memory dissipates 200 microwatts when idle. This performance is unheard of in the present state of the art of SRAM design. When 0.8 micron Fermi-FET technology is employed, 200 mHz performance is readily achieved with less power.

In the drawings and specification, there have been disclosed typical preferred embodiments of the invention and, although specific terms are employed, they are used in a generic and descriptive sense only and not for purposes of limitation, the scope of the invention being set forth in the following claims.

What which is claimed is:

1. A Field Effect Transistor (FET) Differential Latching Inverter (DLI) circuit for sensing signals on first and second bit lines of a memory, comprising:

first and second complementary FET inverters, each of which is connected between first and second reference voltages, and each of which includes a first input, a second input and an output;

each of said first and second complementary inverters producing an inverter transfer function between said first input and said output which is skewed toward one of said first and second reference voltages and which is identical when said first and second inverters turn on and turn off;

the second input of said first inverter being connected to the output of said second inverter, and the second input of said second inverter being connected to the output of said first inverter;

the first bit line being connected to the first input of said first inverter and the second bit line being connected to the first input of said second inverter; and the outputs of said first and second complementary FET inverters producing output signals for said DLI circuit.

2. The DLI circuit of claim 1 wherein said first and second complementary FET inverters each comprise at least one FET of first conductivity type and at least one FET of second conductivity type;

the product of the square channel saturation current and the ratio of width to length of said at least one FET of said first conductivity type being greater than the product of the square channel saturation current and the ratio of width to length of said at least one FET of said second conductivity type, to thereby produce said skewed inverter transfer function.

3. The DLI circuit of claim 1 wherein the inverter transfer function of said first and second complementary FET inverters is skewed toward one of said first and second reference voltages by a factor of 2½ less than the midpoint between said first reference voltage and said second reference voltage.

4. The DLI circuit of claim 1 wherein said first reference voltage is five volts, wherein said second reference voltage is ground, and wherein said first and second complementary FET inverters switch logical state at about one volt.

5. The DLI circuit of claim 1 further comprising:

first and second pull-up circuits, each of which includes an input and an output;

the input of said first pull-up circuit being connected to the output of said second complementary FET inverter, and the output of said first pull-up circuit being connected to the output of said first complementary FET inverter; and the input of said second pull-up circuit being connected to the output of said first complementary inverter, and the output of said second pull-up circuit being connected to the output of said second complementary FET inverter.

6. The DLI of claim 1 further comprising:

first and second pull-up FETs, said first pull-up FET being connected between said first reference voltage and the output of said first complementary FET inverter;

said second pull-up FET being connected between said first reference voltage and the output of said second complementary FET inverter;

the controlling electrode of said first pull-up FET being connected to the output of the second complementary FET inverter; and the controlling electrode of said second pull-up FET being connected to the output of said first complementary FET inverter.

7. The DLI circuit of claim 1 further comprising first and second pull-up circuits, each of which includes an input and an output;

the output of said first pull-up circuit being connected to the output of said first complementary FET inverter, and the output of said second pull-up circuit being connected to the output of said second complementary inverter;

the inputs of said first and second pull-up circuits being responsive to an input signal to force the outputs of said first and second inverters towards said first reference voltage.

8. The DLI circuit of claim 1 further comprising;

first and second pull-up FETs, the first pull-up FET being connected between the output of said first complementary FET inverter and said first reference voltage, the second pull-up FET being connected between the output of said second complementary FET inverter and said first reference voltage; and the controlling electrodes of said first and second pull-up FETs being responsive to an input signal to force the outputs of said first and second inverters towards said first reference voltage.

9. The DLI circuit of claim 1 further comprising:

third and fourth complementary FET inverters, each of which is connected between said first and second reference voltages and each of which includes an input and an output;

the output of said first complementary FET inverter being connected to the input of said third complementary FET inverter and the output of said second complementary FET inverter being connected to the input of said fourth complementary FET inverter, the outputs of said third and fourth complementary FET inverters producing buffered output signals for said DLI circuit;

the FETs of each of said third and fourth inverters producing an inverter voltage transfer function which is symmetrical between said first and second reference voltages.

10. The DLI circuit of claim 9 wherein said third and fourth complementary FET inverters each comprise at least one FET of first conductivity type and at least one FET of second conductivity type;

the product of the square channel saturation current and the ratio of width to length of said at least one FET of said first conductivity type being equal to the product of the square channel saturation current and the ratio of width to length of said at least one FET of said second conductivity type, to thereby produce said symmetrical inverter transfer function.

11. The DLI circuit of claim 9:

wherein said third complementary FET inverter comprises a first FET of first conductivity type and a second FET of second conductivity type, which are serially connected between said first and said second reference voltages, with the controlling electrodes of said first and second FETs being said input of said third complementary inverter, and with the connection between the controlled electrodes of said first and second FETs being the output of said third complementary inverter; and wherein said fourth complementary FET inverter comprises a third FET of first conductivity type and a fourth FET of second conductivity type, which are serially connected between said first and second reference voltages, with the controlling electrodes of said third and fourth FETs being said input of said fourth complementary FET inverter, and with the connection between the controlled electrodes of said third and fourth FETs being the output of said fourth complementary inverter.

* * * * *